United States Patent [19]

Tanuma et al.

[11] Patent Number: 5,008,582
[45] Date of Patent: Apr. 16, 1991

[54] ELECTRONIC DEVICE HAVING A COOLING ELEMENT

[75] Inventors: Chiaki Tanuma, Tokyo; Kazuhiro Itsumi, Kawasaki; Nobuo Iwase, Kamakura; Tomio Ono; Yuu Kondo, both of Yokohama; Kazutaka Saito, Kawasaki, all of Japan

[73] Assignee: Kabushiki Kaisha Toshiba, Kawasaki, Japan

[21] Appl. No.: 515,668

[22] Filed: Apr. 26, 1990

Related U.S. Application Data

[63] Continuation of Ser. No. 150,294, Jan. 29, 1988, abandoned.

[51] Int. Cl.$^5$ .............................................. H01L 41/08
[52] U.S. Cl. .................................... 310/332; 310/800; 310/330; 310/324; 416/83; 417/322; 417/436
[58] Field of Search ................. 310/330–332, 310/328, 800, 340–344; 416/83; 417/322, 436

[56] References Cited

U.S. PATENT DOCUMENTS

| 4,498,851 | 2/1985 | Kolm et al. | 416/83 X |
| 4,595,338 | 6/1986 | Kolm et al. | 310/332 X |

FOREIGN PATENT DOCUMENTS

| 54-2870 | 5/1978 | Japan | 417/322 |
| 54-164008 | 5/1978 | Japan | 417/322 |
| 58-139482 | 1/1983 | Japan | |
| 60-162100 | 3/1984 | Japan | |
| 60-187799 | 12/1984 | Japan | |
| 0224500 | 12/1984 | Japan | 417/322 |
| 61-155700 | 2/1985 | Japan | |
| 0187799 | 9/1985 | Japan | 417/322 |
| 62-62546 | 7/1986 | Japan | |
| 62-72149 | 1/1987 | Japan | |
| 62-81736 | 6/1988 | Japan | |

OTHER PUBLICATIONS

Piezo Ceramic Devices, by Daniel Ruby, *Popular Science*, Jul. 1982, pp. 69–71.
Ferroelectrics, vol. 22, pp. 919–923, "High Field Dielectric Loss of PVF$_2$ and The Electromechanical Conversion Effiency of a PVF$_2$ Fan"; M. Toda, 1979.
Proceedings of the 5th meeting on FMA-5, Kyoto, Japan, J. Application Phys. 24 Suppl., pp. 203–205, "A Piezoelectric Fan Using PZT Ceramics"; M. Yorinaga et al.; 1985.
Ferroelectrics, vol. 22, pp. 911–918, "Theory of Air Flow Generation by a Resonant Type PVF$_2$ Bimorph Cantilever Vibrator"; M. Toda; 1979.

*Primary Examiner*—Mark O. Budd
*Attorney, Agent, or Firm*—Oblon, Spivak, McClelland, Maier & Neustadt

[57] ABSTRACT

In an electric device having a package included an electric circuit element therein, a cooling fan is fixed on the package directly. The fan is formed of piezoelectric elements and a flexible cooling fin. The fan generates the cooling air flow due to vibration of the piezoelectric elements.

4 Claims, 27 Drawing Sheets

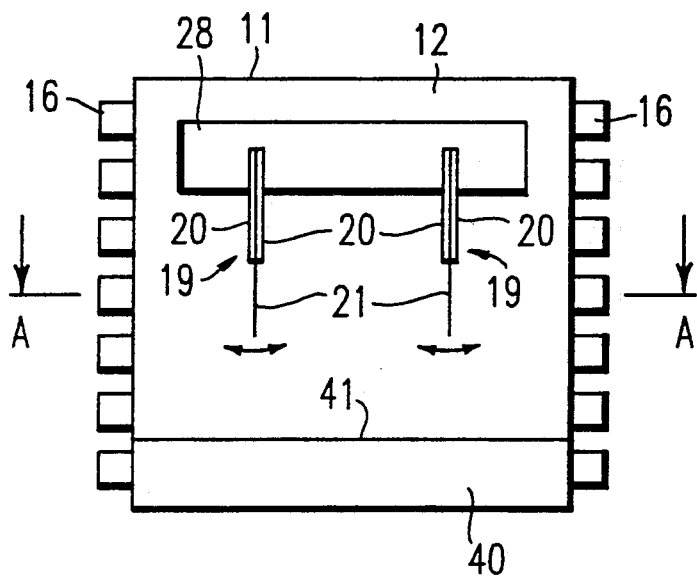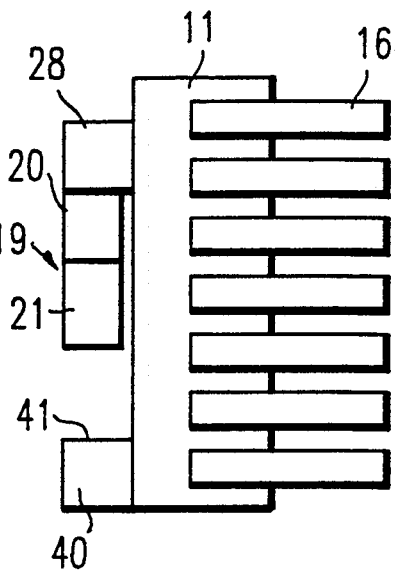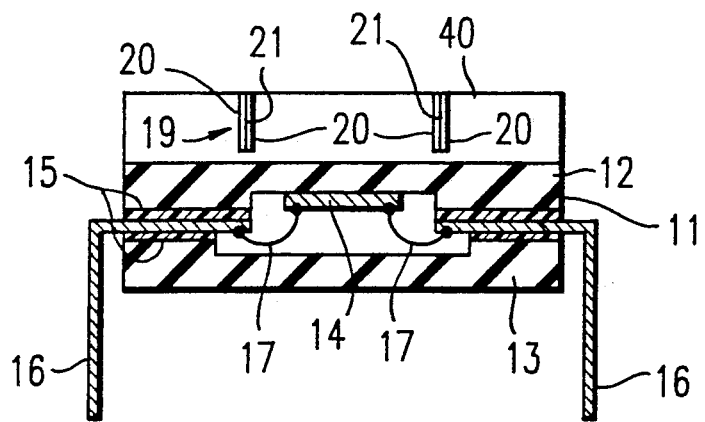
FIG. 18  FIG. 20
FIG. 19

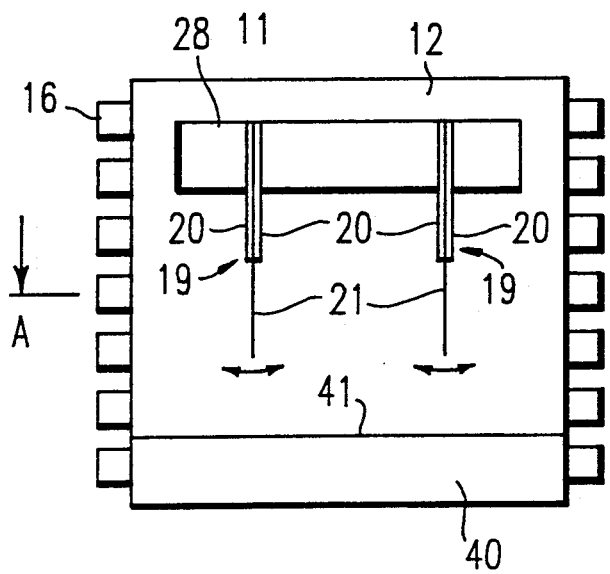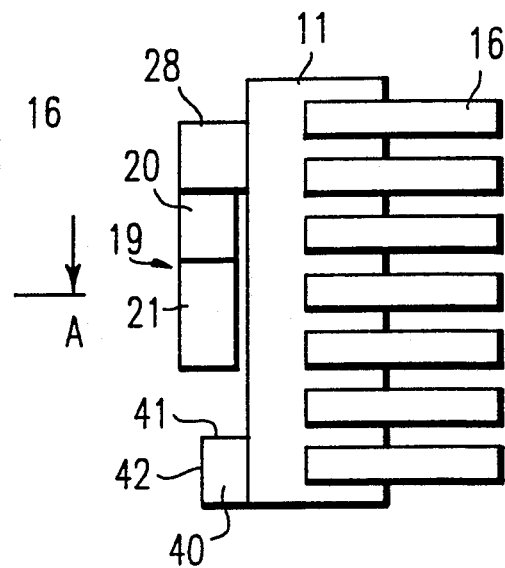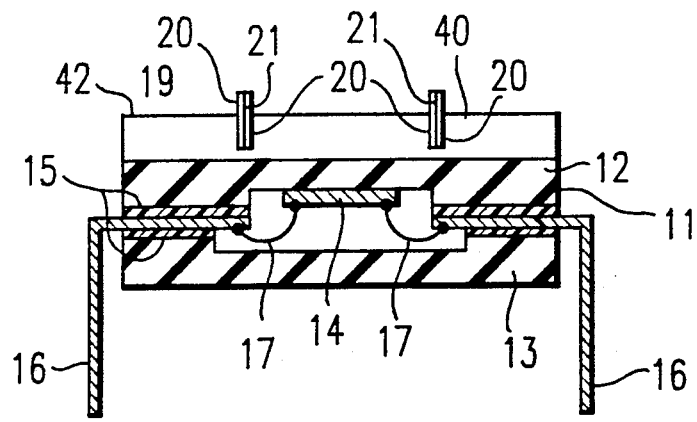
FIG. 22
FIG. 24
FIG. 23

ELECTRONIC DEVICE HAVING A COOLING ELEMENT

This application is a continuation of application Ser. No. 07/150,294, filed on Jan. 29, 1988, now abandoned.

BACKGROUND OF THE INVENTION

1. Field of the Invention

This invention relates generally to electronic devices having electronic circuit elements formed therein, and more particularly to an electronic device with a cooling element disposed for cooling the circuit elements.

2. Description of the Prior Art

In electronic apparatus having a large number of electronic circuit elements, e.g., computers, numerous printed circuit boards assembled with many electronic devices thereon are constructed therein. Electronic devices assembled on the printed circuit boards usually are air cooled using a blower to eliminate the heat generated during the operation of electronic devices. If the density of the generating heat on the plane of the printed circuit board is uniform, effective cooling will be accomplished using an air flow having a predetermined velocity.

However, recently, the temperature variation between electronic devices assembled on the same printed circuit board has increased with increases in the integration of logic elements and the assembly density of electronic components. In this case, the system needs a larger air flow supply to suppress the temperatures of the electronic devices below a predetermined maximum temperature. This need for a larger air flow in the conventional cooling method causes problems. Over cooling of smaller components, which generate little heat occurs, and the cooling efficiency of the device becomes worse. The loss of air flow is greater in proportion to the increased complexity of the printed circuit boards. Thus, an operator has to supply a larger air flow than is necessary, and a larger blower system is required. This causes additional problems, such as increased noise, and the like.

To overcome these problems, other conventional constructions having lower thermal resistance have been utilized, and cooling fins have been fixed on the electronic devices. However, such fins could not be enlarged sufficiently, because of space limitations resulting from the high density construction of the electronic devices.

Another conventional cooling system is shown in Japanese Patent Publication SHO 60-11840. In this system, air flows are selectively supplied to aligned electronic devices generating the higher temperatures by separating the air flows using flat plates. However, this system also needs a large blower. Moreover, freedom of design for the parts alignment on the printed circuit board becomes limited, because electronic devices generating the higher temperatures must be aligned with the air flows.

BRIEF SUMMARY OF THE INVENTION

It is an object of the invention is to provide an improved electronic device having efficient cooling elements.

Another object of the invention is to provide an improved electronic device having fans fixed directly therein for cooling only that device.

Briefly, in accordance with one aspect of the invention, there is provided an electronic device having a package included an electronic circuit element therein, and a fan is fixed on the package directly. Specifically, the fan according to the invention includes piezoelectric elements and a flexible fin.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 1 is a plan view, FIG. 2 is a cross-sectional view taken along line A—A of FIG. 1, and FIG. 3 is a perspective diagram;

FIG. 4 is a plan view, and FIG. 5 is a cross-sectional view taken along line A—A of FIG. 4;

FIG. 6 is a plan view, and FIG. 7 is a cross-sectional view taken along line A—A of FIG. 6;

FIG. 8 is a plan view, and FIG. 9 is a cross-sectional view taken along line A—A of FIG. 8;

FIG. 10 is a plan view, and FIG. 11 is a cross-sectional view taken along line A—A of FIG. 10;

FIG. 12 is a perspective view, and FIG. 13 is a plan view of FIG. 12;

FIG. 15 is a perspective view, and FIG. 16 is a plan view of FIG. 15;

FIGS. 18 through 21 are diagrams illustrating schematic configurations of the electronic device according to a tenth embodiment of the invention, and FIG. 18 is a plan view, FIG. 19 is a cross-sectional view taken along line A—A of FIG. 18, FIG. 20 is a side view, and FIG. 21 is a perspective view;

FIGS. 22 through 24 are diagrams illustrating schematic configurations of the electronic device according to an eleventh embodiment of the invention, and FIG. 22 is a plan view, FIG. 23 is a cross-sectional view taken along line A—A of FIG. 22, and FIG. 24 is a side view;

FIG. 25 is a plan view, FIG. 26 is a cross-sectional view taken along line A—A of FIG. 25, and FIG. 27 is a side view;

FIG. 28 is a plan view, FIG. 29 is a cross-sectional view taken along line A—A of FIG. 28, and FIG. 30 is a enlarged plan view of a bimorph vibrator used in the thirteenth embodiment, and FIG. 31 is an enlarged cross-sectional view of FIG. 30;

FIG. 32 is a plan view, and FIG. 33 is a cross-sectional view taken along line A—A of FIG. 32;

FIG. 34 is a plan view, and FIG. 35 is a cross-sectional view taken along line A—A of FIG. 34;

FIG. 36 is a plan view, and FIG. 37 is a cross-sectional view taken along line A—A of FIG. 36;

FIG. 38 is a plan view, and FIG. 39 is a cross-sectional view taken along line A—A of FIG. 38;

FIG. 41 is a perspective view, and FIG. 42 is a side view taken in the direction of the arrow B in FIG. 41;

FIG. 43 is a perspective view, and FIG. 44 is a side view taken in the direction of the arrow B in FIG. 43;

FIG. 45 illustrates a second comparative sample, and FIG. 46 illustrates a third comparative sample;

DESCRIPTION OF THE PREFERRED EMBODIMENTS

Figure 47:
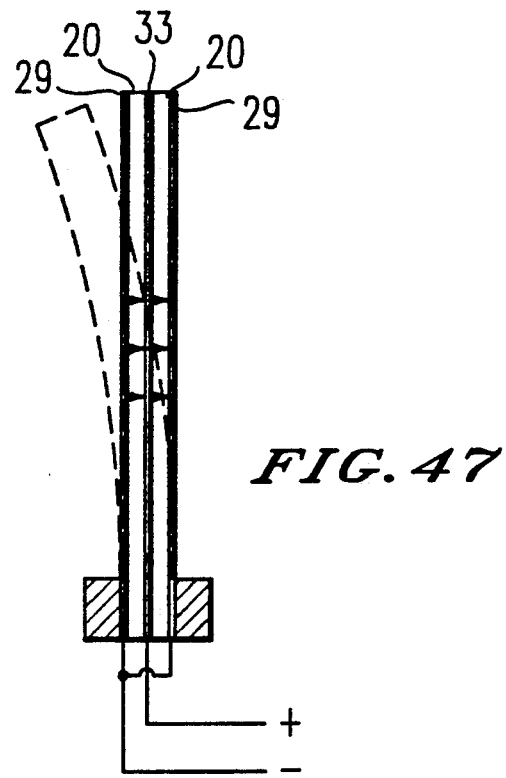
FIG. 47 is a cross-sectional view to assist in explaining the operations of a bimorph vibrator used in embodiments of the invention.

The piezoelectric element of this invention is constructed from a piezoelectric plate consisting of piezoelectric ceramic material or a piezoelectric high polymer material and electrodes which are formed on the opposite side surfaces thereof. FIG. 47 shows a piezoelectric bimorph which forms a piezoelectric element. The element 20 includes two piezoelectric elements 20 having polarizations shown by arrows, and first electrodes 29 and second electrode 33. The piezoelectric bimorph bends in the direction to the dotted position when a negative voltage is applied to first electrodes 29 and a positive voltage is to second electrode 33. If opposite polarities are applied on respective electrodes 29 and 33, the piezoelectric bimorph will bend in the opposite direction.

In the invention, the piezoelectric bimorph is used as the cooling fan for the electronic device utilizing an A.C. voltage to generate vibration. The invention can individually cool the electronic device, because the cooling element is a part of one body with the electronic device. Therefore, if the invention is applied to electronic parts generating high temperature, the heat of the all the electronic parts may be efficiently dissipated without the need for a large air flow or a big blower.

This contributes to a substantial savings of energy, and reduces noise. In addition, the assembling density of the components of a printed circuit board remains high, because the bimorph vibrator is very small. Furthermore, there is more freedom in the electronic parts alignment as compared with the conventional system, where alignment of the electronic parts on the printed circuit board must be made according to the volume of the generated heat from each electronic parts. Thus, the ease of design and the assembling density can be improved. Referring now in particular to the drawings, wherein like reference characters designate like or corresponding parts throughout and repeated detailed explanation is omitted.

Figure 1:
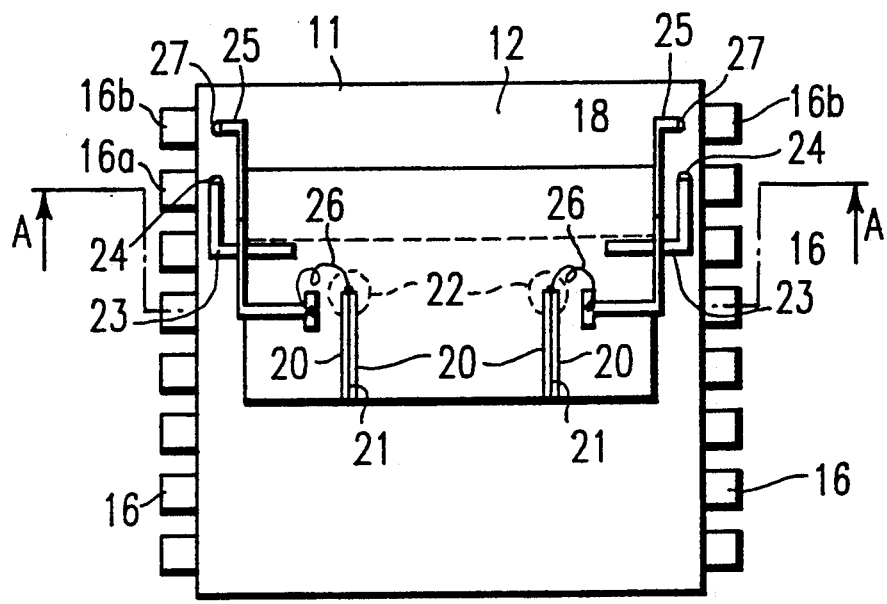
FIG. 1 through 3 are diagrams illustrating schematic configurations of an electronic device according to a first embodiment of the invention.
Figure 2:
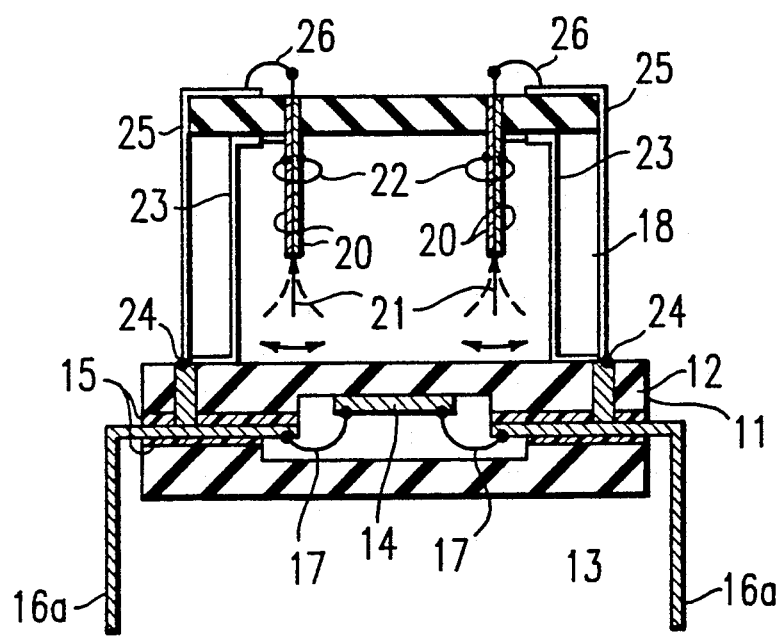
Figure 3:
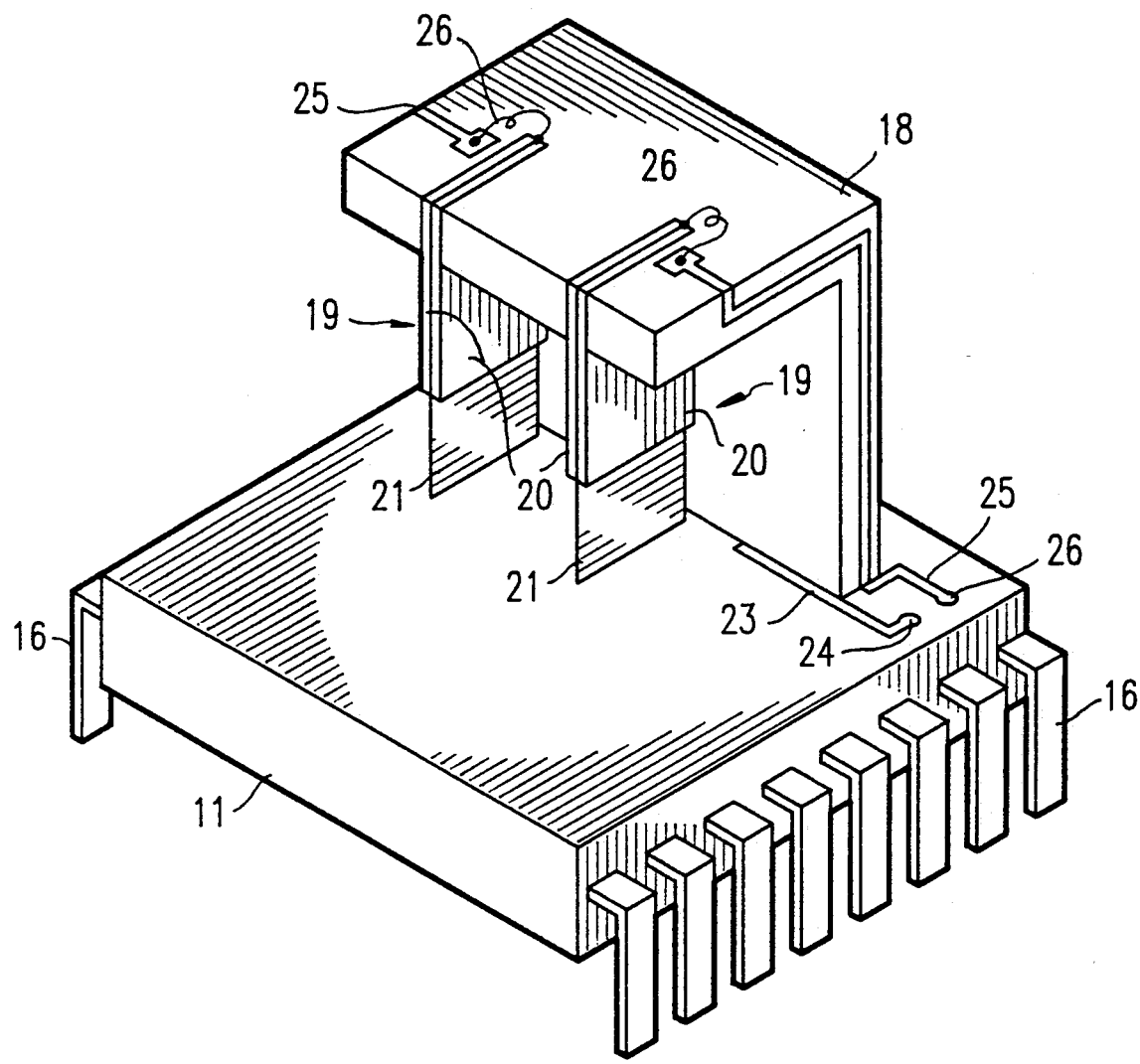

First Embodiment:

FIGS. 1 through 3 are diagrams illustrating schematic configurations of a First Embodiment of the invention, and FIG. 1 is a plan view, FIG. 2 is a cross-sectional view taken along line A—A of FIG. 1 and FIG. 3 is a perspective diagram. A package body 11 is formed of a ceramic base 12 and a ceramic cap 13. A semiconductor chip 14 is joined on the ceramic base 12, and sealed by a low melting temperature glass 15. The ceramic base 12 and the ceramic cap 13 are made of ceramic materials with a high thermal conductivity, e.g., AlN or $Al_2O_3$, and the like. Electrode terminals of the semiconductor chip 13 are taken out the package body 11 using a lead frame 16 through bonding wires 17, e.g., made of Au. A ceramic L-shaped supporting member 18 of high thermal conductivity is fixed outside of the ceramic base 12 using an adhesive agent, e.g., an epoxy resin or the like. Two cooling fans 19, formed of bimorph vibrators having piezoelectric elements 20 on each side of a vibration fin 21, are fixed on the ceramic supporting member 18 facing the package body 11.

In this embodiment, the outside electrodes (not shown) of the piezoelectric elements 20 are connected by first leads 22 to first pattern wirings 23 using solder. The first pattern wirings 23 are connected to terminals (not shown) formed on first through holes 24 opened on the ceramic base 12. These first through holes 24 have the function to connect between leads 16a of the lead frame 16 and the terminals on the first through holes 24 using an electro-conductive material. A well known metalizing method is preferable for forming the pattern wirings on the ceramic members wherein tungsten or molybdenum is sintered on the ceramic body.

Inner electrodes (not shown) of the piezoelectric elements 20 are connected to second pattern wiring 25 using second leads 26. Second pattern wirings 25 are connected to other leads 16b of the lead frame 16 through second through holes 27.

In this embodiment, the electrodes of piezoelectric elements 20 are connected to two cooling fans 19 using four leads of the lead frame 16. Of course, if common pattern wirings are provided on the positive and negative electrodes of the two cooling fans, it is possible to use only two leads of the lead frame 16. The pattern wirings formed along the side wall of the package body 11 may be directly connected to the leads of the lead frame 16 using the soldering process when the intervals between each lead of the lead frame 16 are narrow.

The pointed ends of cooling fans 19 vibrate as shown by the arrows in FIG. 2 when an A.C. voltage is supplied to the bimorph vibrators through the lead frame 16. For example, if 10 volts is applied to a cooling fan which is constructed of ceramic piezoelectric elements having a thickness of 100 $\mu$m, a width of 5 mm and a length of 6 mm, and a brazen vibration fin thickness of 50 $\mu$m, and a width 5 mm, an amplitude of vibration of the tip of the cooling fan of 1 mm and an average velocity of vibration of 1.4 m/sec are obtained. In this case, the package body is one inch square. As a result, the surface of the ceramic base can be efficiently cooled.

Figure 4:
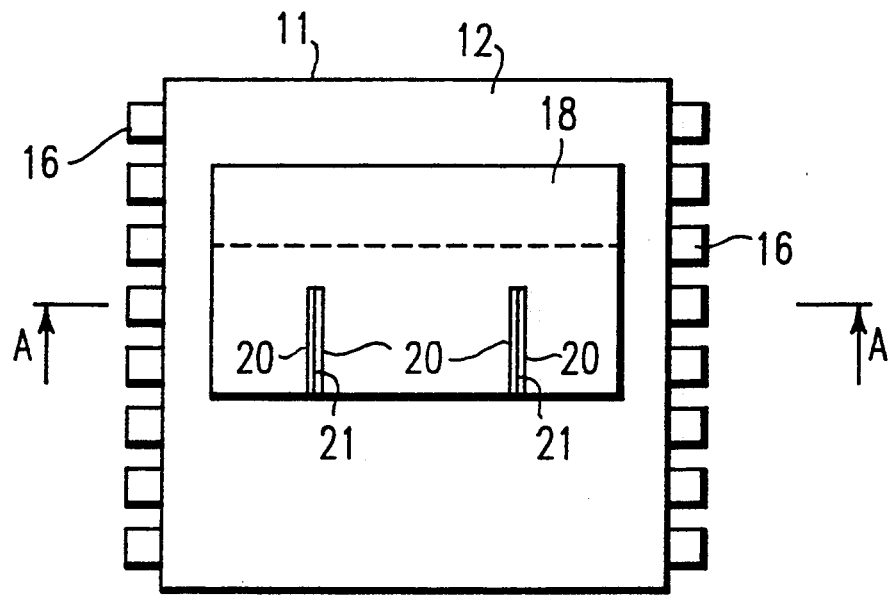
FIGS. 4 and 5 are diagrams illustrating schematic configurations of the electronic device according to a second embodiment of the invention.
Figure 5:
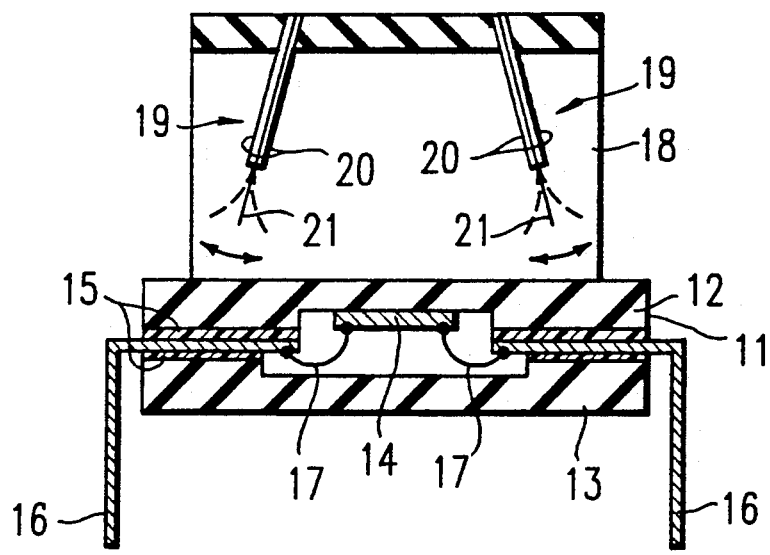

Second Embodiment:

FIGS. 4 and 5 are diagrams illustrating schematic configurations of the Second Embodiment of the invention, and FIG. 4 is a plan view and FIG. 5 is a cross-sectional view taken along line A—A of FIG. 4. The wiring which applies the A.C. voltage to piezoelectric elements 20 preferably is the same as that described in the First Embodiment. Two cooling fans 19 are fixed so that they diverge from one another. Namely, both fans 19 are not parallel. This embodiment is especially useful for electronic devices which have a broad heated area. The divergent vibration fins 21 can generate a wider cooling area.

Figure 6:
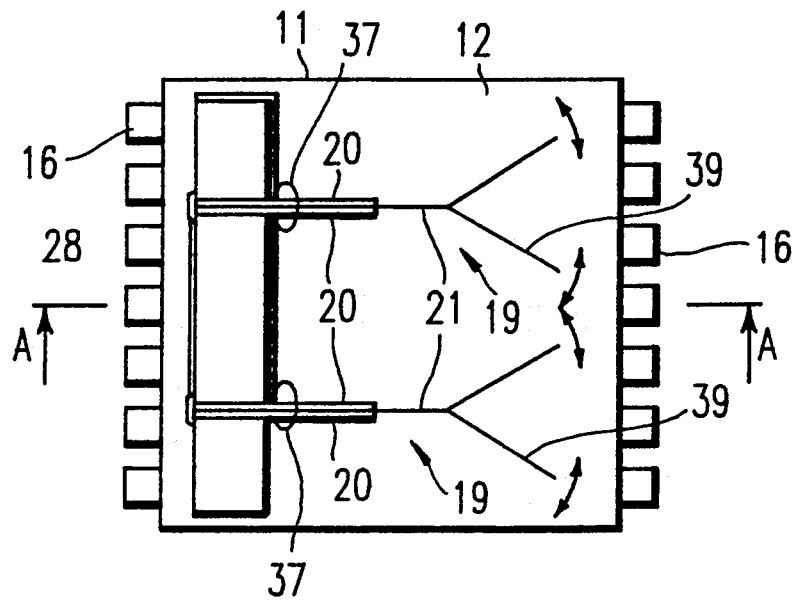
FIGS. 6 and 7 are diagrams illustrating schematic configurations of the electronic device according to a third embodiment of the invention.
Figure 7:
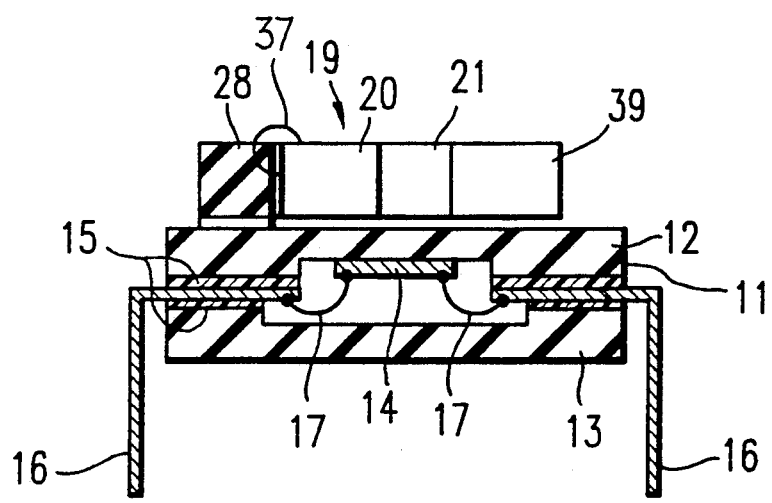

Third Embodiment:

FIGS. 6 and 7 are diagrams illustrating schematic configurations of the Third Embodiment of the invention, and FIG. 6 is a plan view and FIG. 7 is a sectional view along line A—A of FIG. 6. In this Third Embodiment, a ceramic supporting member 28 is fixed on the ceramic base 12 of the package body 11 using an adhesive agent, e.g., epoxy resin. Two cooling fans 19 are fixed to the base 12 in parallel relation.

Figure 49:
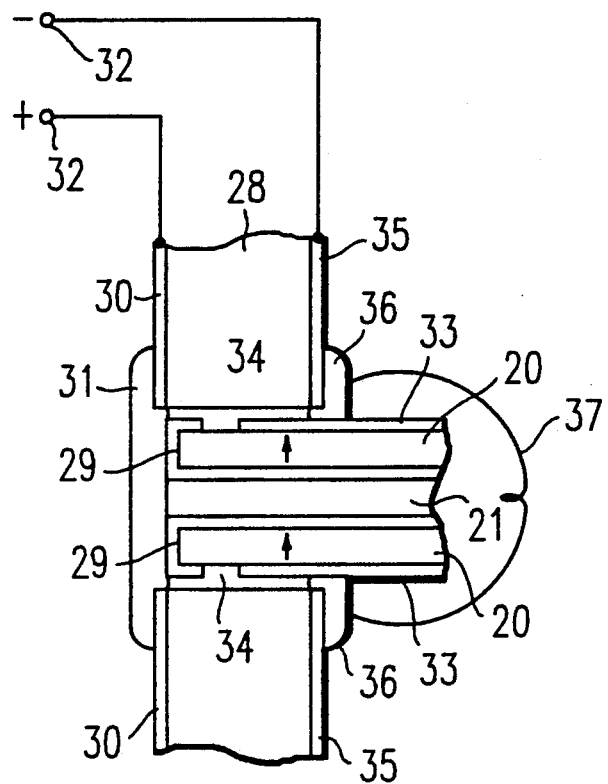
FIG. 49 is an enlarged plan view illustrating the connecting part of the bimorph vibrator used in the third embodiment of the invention.

FIG. 49 is a enlarged plan view illustrating the connecting part of the bimorph vibrator used in the Third Embodiment of the invention. The supporting member 28 supports piezoelectric elements 20. First electrodes 29 are joined to the vibration fin 21 of the piezoelectric elements 20, and a part of each first electrode 29 extends to the opposite surface of one of the piezoelectric elements 20. These two first electrodes 29 are electrically connected to each other as the positive (+) electrode on a wall surface of the supporting member 28 using conventional pattern wiring technology. Namely, first electrodes 29 are joined to first metal layers 30 formed on the wall surface of the supporting member 28 using a first solder 31. The first metal layers 30 are connected to a first through hole terminal 32, which is joined to the lead frame using the method above-mentioned in the First Embodiment.

Another two second electrodes 33 as the negative (−) electrode are isolated from first electrodes 29 through insulator layers 34. These two second electrodes 33 are joined to second metal layers 36 formed on the opposite wall surfaces from the first metal layer 30 using second solders 36. Both second solders 36 are electrically connected to each other by a lead 37. Second metal layers 36 are connected to a second through hole terminal 38, which is joined to another lead of the lead frame. The connection between the piezoelectric elements 20 and the lead frame is may be made not only by the through hole system, but also by the pattern wiring system formed along the side wall of the package body.

Returning to FIG. 6, the cooling fans 19 are driven as follows. An A.C. voltage is applied to the piezoelectric elements 20, holding the vibration fins 21, through the first and second metal layers 30 and 35. Thus, Y shaped sub-vibration fins 39, forming a part of the vibration fins 21, vibrate in the direction shown by the arrows, and an air flow is generated. The effect of this embodiment will be explained together with the Fourth Embodiment.

Figure 8:
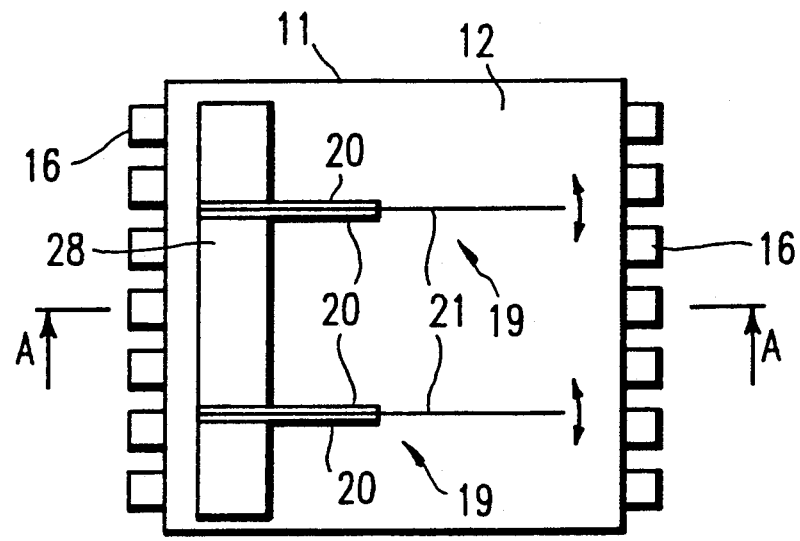
FIGS. 8 and 9 are diagrams illustrating schematic configurations of the electronic device according to a fourth embodiment of the invention.
Figure 9:
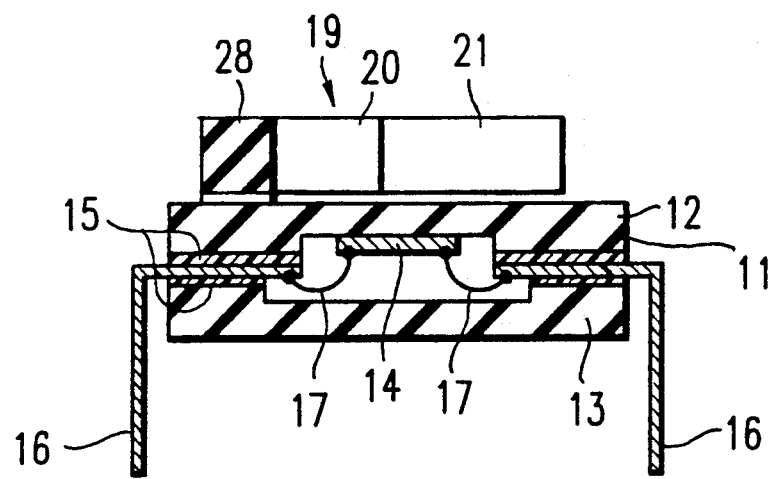

Fourth Embodiment:

FIGS. 8 and 9 are diagrams illustrating schematic configurations of the Fourth Embodiment of the invention, and FIG. 8 is a plan view, and FIG. 9 is a cross-sectional view taken along line A—A of FIG. 8. In particular, this Fourth Embodiment is a comparative example to demonstrate the effect of the Third Embodiment of the invention with cooling fans 19 having vibration fins 21 without the sub-vibration fins.

Table 1 shows the measured data on the thermal resistance of Third and Fourth Embodiments to compare the effects of both Embodiments. The driving frequencies for each piezoelectric element was equal.

TABLE 1

| base material | thermal resistance (°C./W) | | |
| --- | --- | --- | --- |
| | package only | comparative example | Third Embodiment |
| AlN | 31.4 | 18.3 | 13.5 |
| Al$_2$O$_3$ | 38.3 | 25.4 | 19.6 |

It is clear from the example that the Fourth Embodiment of the invention has sufficiently decreased the thermal resistance compared to the device only without the cooling fans. Namely, the cooling fans utilizing the piezoelectric vibration are very useful to cool the package containing the electronic device. The Third Embodiment having the sub-vibration fins accelerates cooling compared with the Fourth Embodiment.

Figure 10:
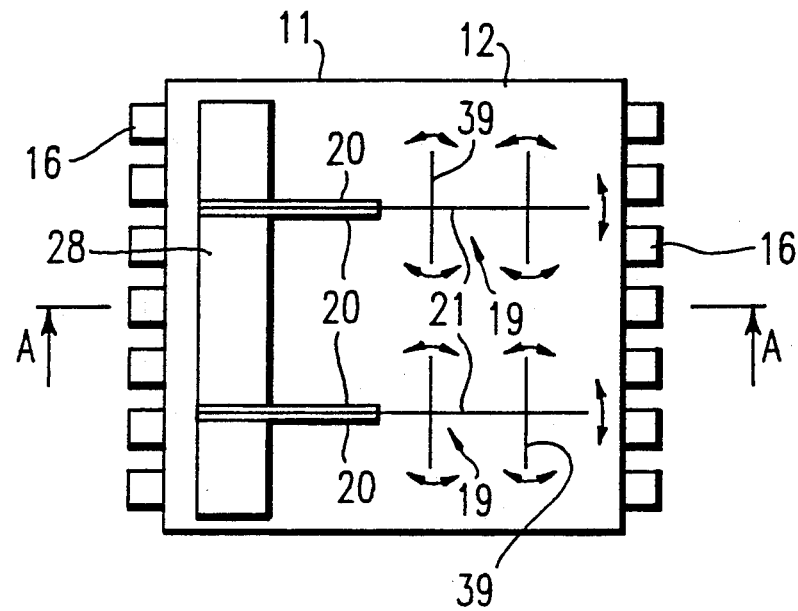
FIGS. 10 and 11 are diagrams illustrating schematic configurations of the electronic device according to a fifth embodiment of the invention.
Figure 11:
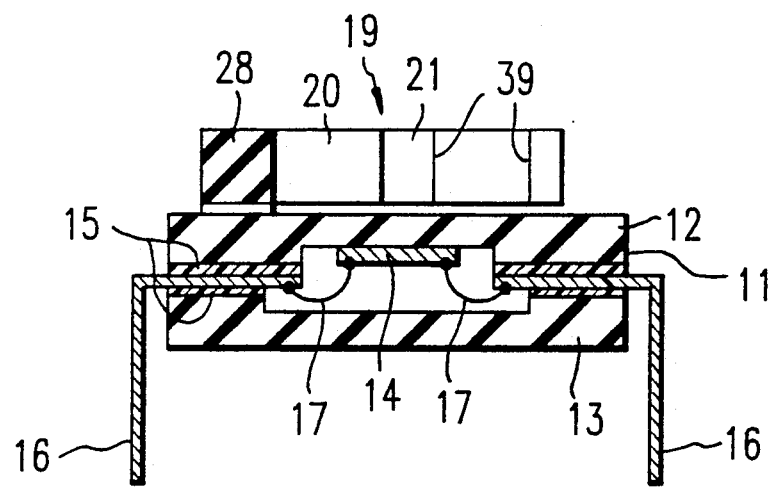

Fifth Embodiment:

FIGS. 10 and 11 are diagrams illustrating schematic configurations of a Fifth Embodiment of the invention, and FIG. 10 is a plan view, and FIG. 11 is a cross-sectional view taken along line A—A of FIG. 10. In this embodiment, the cooling fans 19 are comprised of many sub-vibration fins 39 (five fins being used in this embodiment) provided with each vibration fin 21. This embodiment is useful for a large area package which generates much heat.

Figure 12:
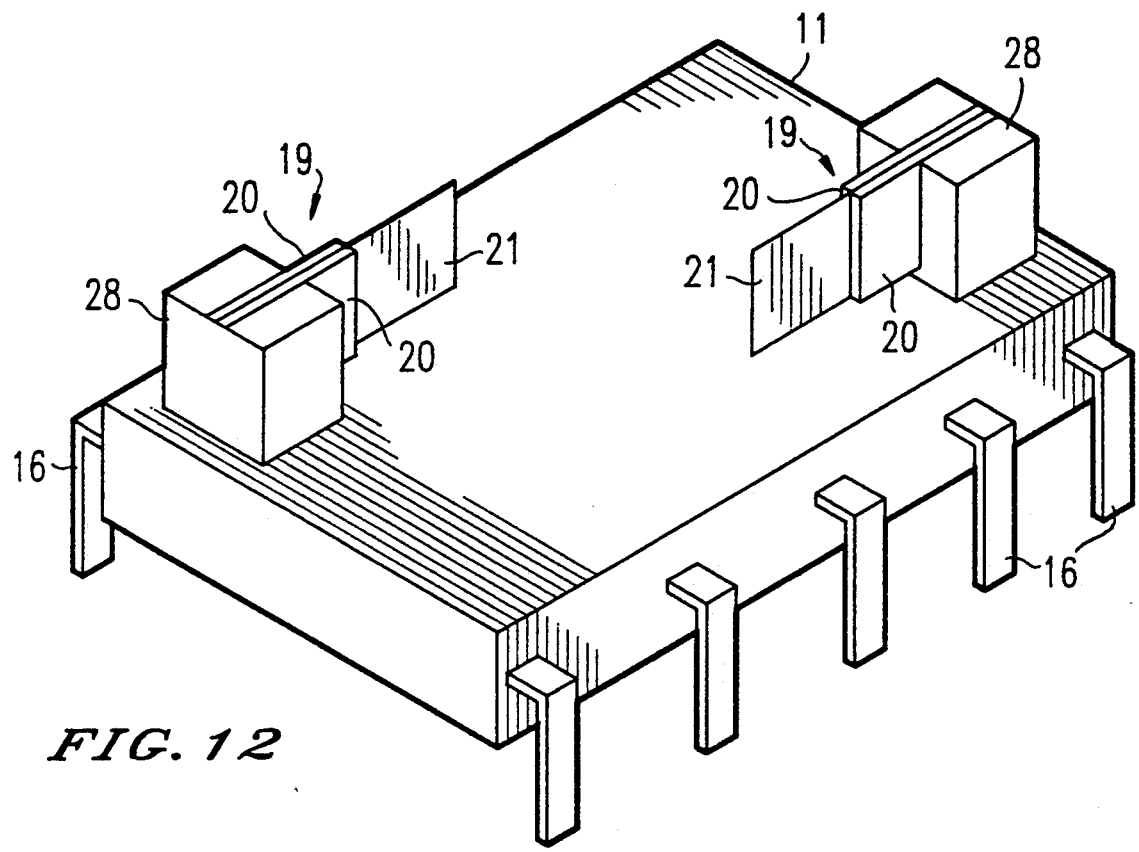
FIGS. 12 and 13 are diagrams illustrating schematic configurations of the electronic device according to a sixth embodiment of the invention.
Figure 13:
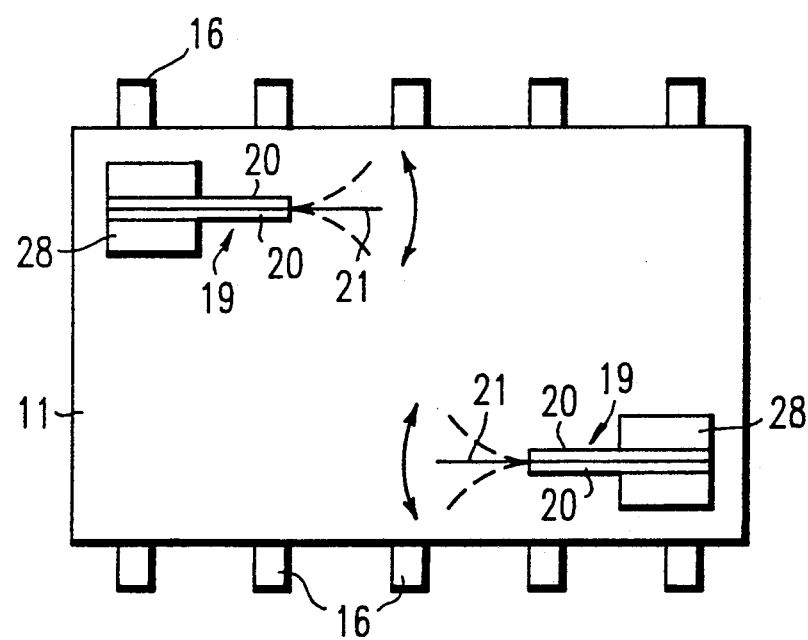

Sixth Embodiment:

FIGS. 12 and 13 are diagrams illustrating schematic configurations of a Sixth Embodiment of the invention, and FIG. 12 is a perspective diagram, and FIG. 13 is a plan view of the device of FIG. 12. Two supporting members 28 are fixed on the corners of the surface of the package body 11 formed of AlN, Al$_2$O$_3$ or the like, having high thermal conductivity using the adhesive agent, e.g., the epoxy resin. Cooling fans 19 are faced each other each on supporting member 28. Each cooling fan includes piezoelectric elements 20 with a vibration fin 21 sandwiched therebetween.

If A.C. voltage is applied to the piezoelectric elements 20, the vibration plates 21 vibrate in the directions of the arrows, and generate a cooling air flow. In this embodiment a cooling air flow velocity of 1.2 m/sec has been obtained at the pointed end of the vibration fins 21 when cooling fans 19 are dried at an applied voltage of 10 V and a frequency of 1 KHz.

Table 2 shows the comparative effects of this embodiment and above-mentioned examples of Table 1.

TABLE 2

| base material | thermal resistance (°C./W) | | |
|---|---|---|---|
| | package only | comparative example | sixth Embodiment |
| AlN | 31.4 | 18.3 | 13.5 |
| Al$_2$O$_3$ | 38.3 | 25.4 | 19.6 |

It is clear that the cooling fans 19 facing each other can efficiently cool the package. This is because the cooling air flow is generated mainly on the center of the package, where the volume of the heat is larger than at the periphery of the package.

Figure 14:
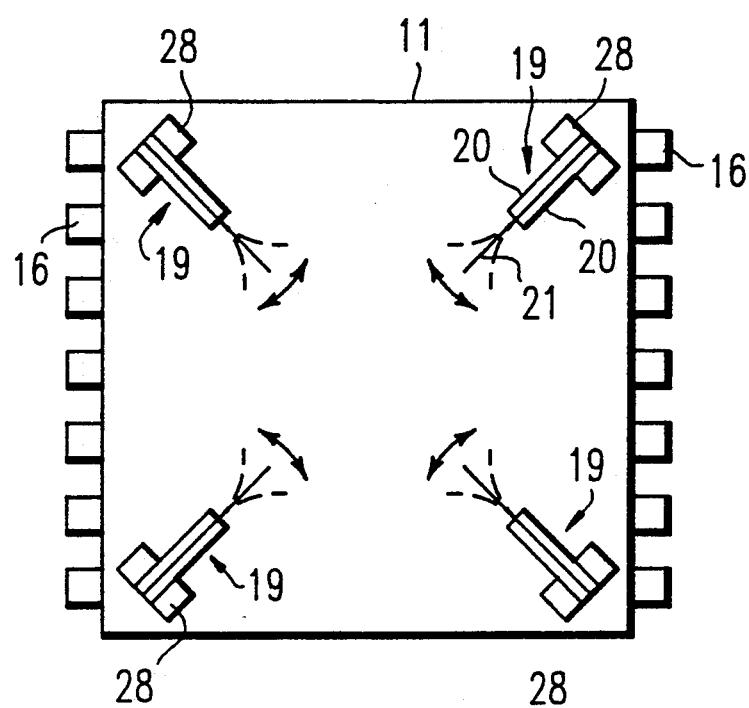
FIG. 14 is a plan view illustrating a schematic configuration of the electronic device according to a seventh embodiment of the invention.

Seventh Embodiment:

FIG. 14 is a plan view illustrating a schematic configuration of a Seventh Embodiment of the invention. Four supporting members 28 are fixed on the four corners on the surface of the package body 11, and a cooling fan is provided on each supporting member 28. Each cooling fin 21 faces the center of the package body 11. With this embodiment cooling of the package can be increased by adding additional cooling fans and adjusting the direction of the vibration fins being as compared to the Sixth Embodiment.

Eighth Embodiment:

This embodiment will be explained using above-mentioned FIGS. 8 and 9, and these detailed concrete explanations are omitted. In the above-mentioned description, cooling fans 19 were driven using an A.C. voltage and vibration fins 21 were vibrated in the direction shown by the arrows. However, in this embodiment, cooling fans 19 are driven using resonance frequencies of the high order.

Figure 48A:
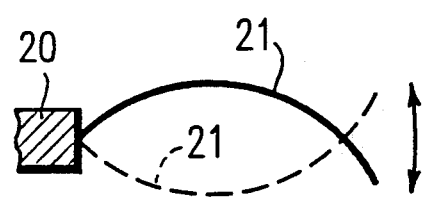
FIGS. 48(a) and (b) are wave form charts to assist in explaining the operation of the bimorph vibrator used in embodiments of the invention.
Figure 48B:
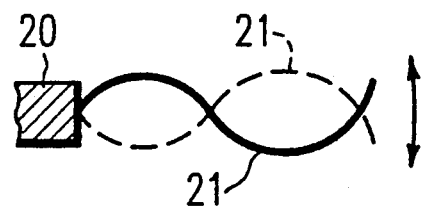

FIGS. 48(b) and (b) are waveform charts providing assistance in explaining the operation of the vibration by the resonance frequencies of a high order.

Vibrations of the vibration fins 21 are changeable according to the frequencies of the applied voltage for the piezoelectric elements 20. If the resonance frequencies are raised, the vibration fin 21 assumes a first order vibration mode having a large amplitude (shown in FIG. 48(a)), and the vibration of the fin 21 assumes a second order vibration mode (shown in FIG. 48(b)) in proportion to the increases in the resonance frequency.

In this embodiment, the cooling fan, which is comprised of a piezoelectric element 20 (the length is 6 mm) and a vibration fin 21 (length of the part not sandwiched by the piezoelectric elements is 9 mm, is driven by an A.C. voltage of 10 V having a second order resonance frequency of 1.8 KHz. The effect of this embodiment is as follows.

The air flow velocity was 0.8 m/sec when the first order resonance frequency voltage (316 Hz) was applied. However, in this embodiment, an air flow velocity of 1.4 m/sec was obtained with the above-mentioned second order resonance frequency voltage (1.8 KHz).

This invention is not limited this embodiment. The maximum air flow velocity generated by the cooling fan is proportional to the product of the displacement value of the vibration fin and the driving frequencies. If the cooling fan is driven by two or more high order resonance frequencies, the air flow velocity will be decreased only by the changing value of the vibration mode and the decreasing value of the displacement of the vibration fin compared to the first order resonance frequency drive. However, this invention can increase the air flow velocity due by selection of the length of the cooling fan. The driving source also may use other magnetic effects.

Figure 15:
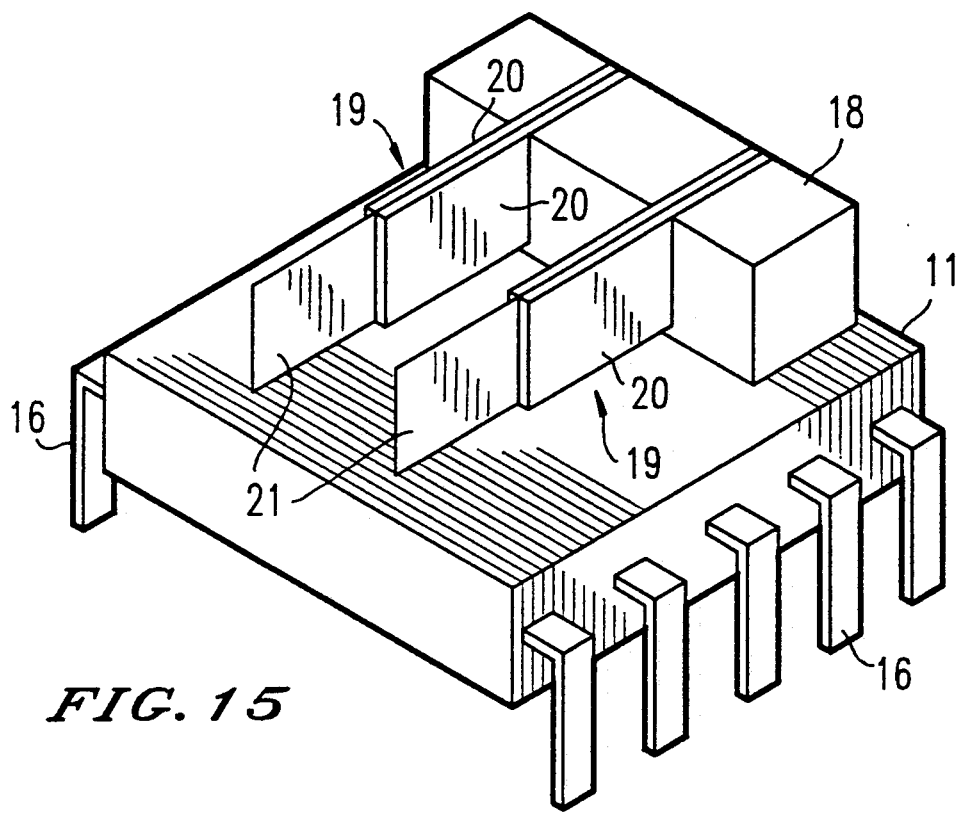
FIGS. 15 and 16 are diagrams illustrating schematic configurations of the electronic device according to a ninth embodiment of the invention.
Figure 16:
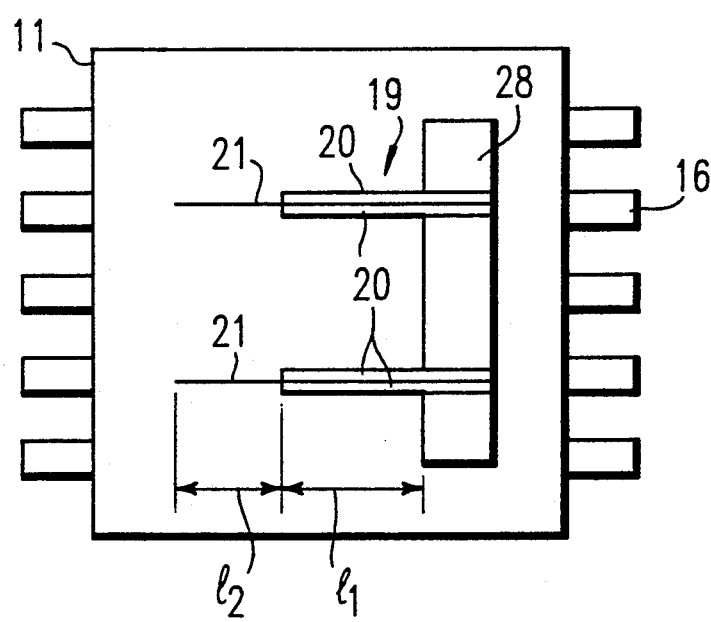

Ninth Embodiment:

FIGS. 15 and 16 are diagrams illustrating schematic configurations of the Ninth Embodiment of the invention, and FIG. 15 is a perspective diagram, and FIG. 16 is a plan view of the device of FIG. 15. It is a feature of this embodiment that the ratio of the effective length $l_1$ of the vibration fins 21 and the effective length $l_2$ of the piezoelectric elements 20 was established as $l_2:l_1 = 4:6$.

Figure 17:
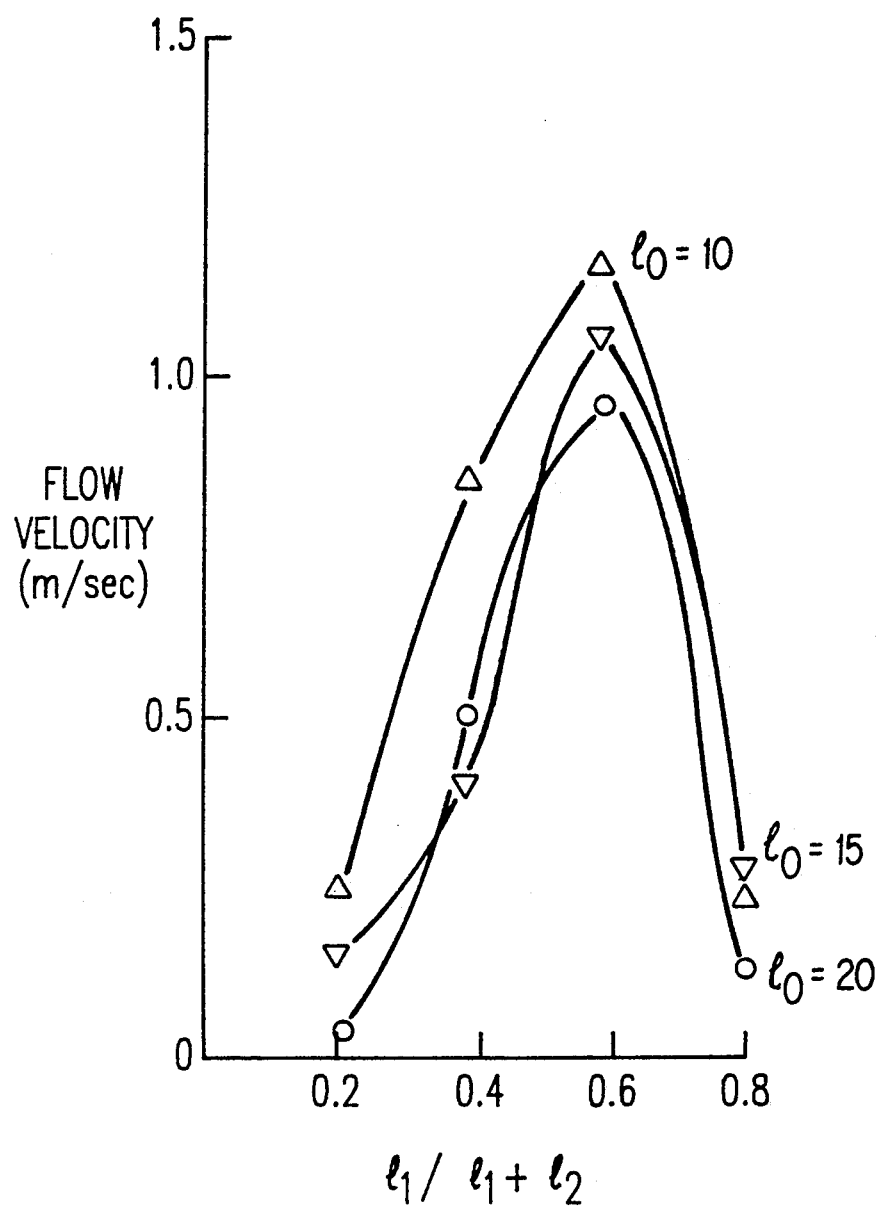
FIG. 17 is a graph illustrating the characteristics of vibrators of the ninth embodiment of the invention.

The effective length of the piezoelectric elements 20 is the length $l_1$ of the portion not supported by the ceramic 28. The effective length of the vibration fins 21 is the length $l_2$ of the portion unsupported by the piezoelectric elements 20. The effective length of the cooling fans is the total length $l_0$ unsupported by the ceramic supporting member 18, namely, $l_0$ is $l_0 = l_1 + l_2$. FIG. 17 is a graph illustrating the changes caused by varying the ratios of Ninth Embodiment. The ordinate is the air flow velocity of the cooling fan 19 measured on the some point forward of it, and the abscissa is the ratio. It is apparent that the maximum air flow velocity is obtained at $l_2:l_1 = 4:6$, namely $l_1/l_1 + l_2 = l_1/l_0 = 0.6$, based on several cases of different effective length $l_0$ of the cooling fan 19. In this case, the vibration mode is the first mode.

In this embodiment, it was established that the optimum ratio was $l_1/l_1 + l_2 = 0.6$. However, the invention is not limited by this data. For example, if the ratio is $0.5 \leq l_1/l_1 + l_2 \leq 0.7$ and $l_1$, $l_2$ are suitably change, the desired cooling effect can be sufficiently obtained.

Figure 21:
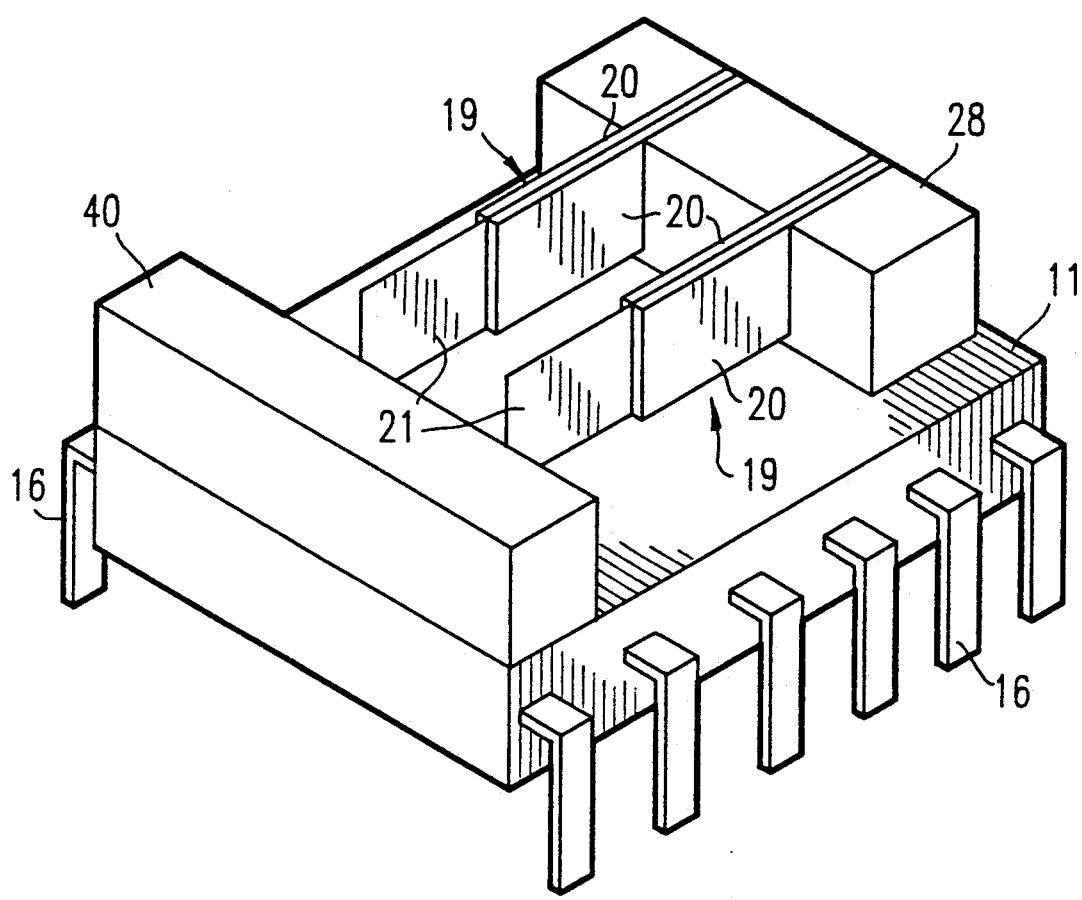

Tenth Embodiment:

FIGS. 18 through 21 are diagrams illustrating schematic configurations of the Tenth Embodiment of the invention, and FIG. 18 is a plan view, FIG. 19 is a cross-sectional view taken along line A—A of FIG. 18, FIG. 20 is a side view, and FIG. 21 is a perspective view. In this Embodiment, there are cooling fans 19 and cooling fins 40 opposite to the cooling fans 19. Cooling fins 40 made of A$_l$ are fixed using epoxy resin on the outer face portion of the package body. The heat generated from the package body 11 is effectively radiated primarily from the surface 41 of the cooling fin 40.

Eleventh Embodiment:

FIGS. 22 through 24 are diagrams illustrating schematic configurations of the Eleventh Embodiment of the invention, and FIG. 22 is a plan view, FIG. 23 is a cross-sectional view taken along line A—A of FIG. 22, and FIG. 24 is a side view. In this embodiment, the height of the cooling fin 40 is less than the height of the cooling fans 19. If the height of the cooling fin 40 is half of the height of the cooling fans, the cooling fans can cool the surface 41 and the surface 42. It is useful in the case where the space for the cooling fin is limited.

Figure 25:
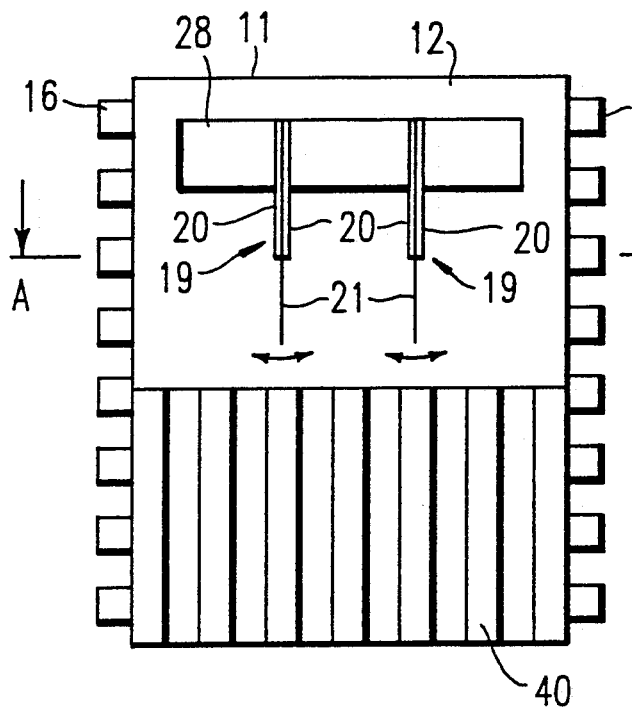
FIGS. 25 through 27 are diagrams illustrating schematic configurations of the electronic device according to a twelfth embodiment of the invention.
Figure 27:
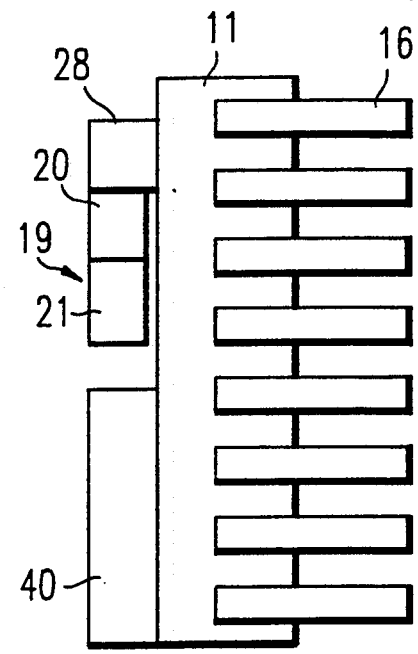
Figure 26:
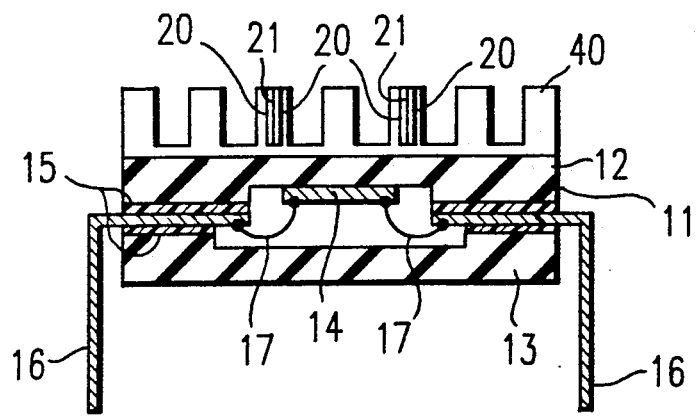

Twelfth Embodiment:

FIGS. 25 through 27 are diagrams illustrating schematic configurations of the Twelfth Embodiment of the invention, and FIG. 26 is a plan view, FIG. 26 is a cross-sectional view taken along line A—A of FIG. 25, and FIG. 27 is a side view. It is a feature of this embodiment that the cooling fin 40 is comb-shaped to increase the thermal radiation surface area.

Figure 28:
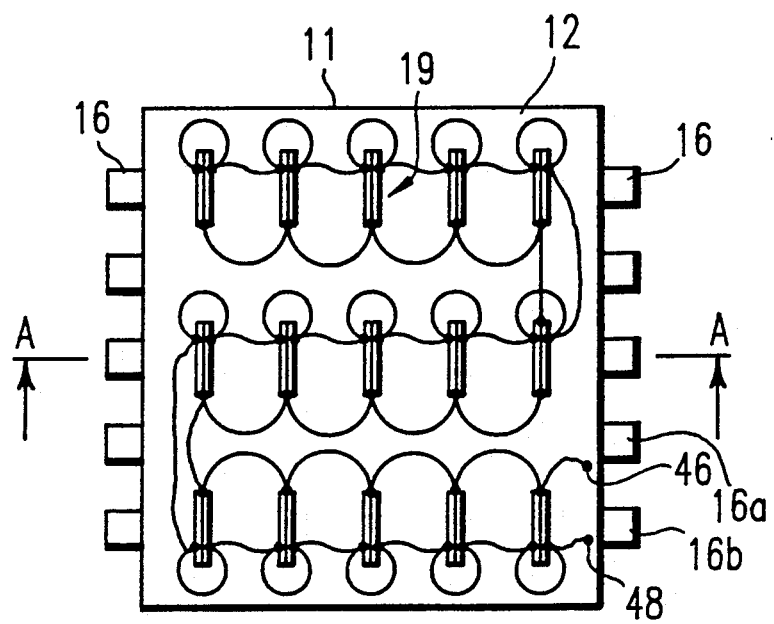
FIGS. 28 through 31 are diagrams illustrating schematic configurations of the electronic device according to a thirteenth embodiment of the invention.
Figure 29:
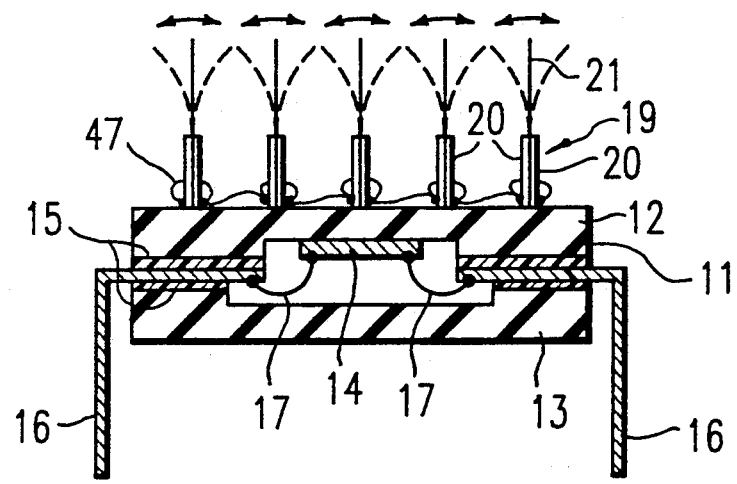
Figure 30:
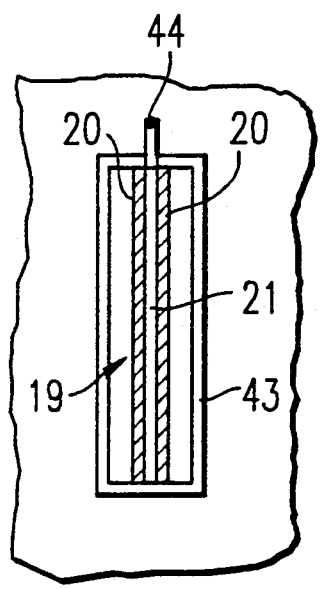
Figure 31:
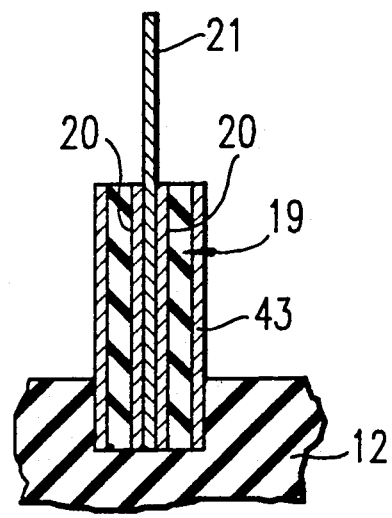

Thirteenth Embodiment:

FIGS. 28 through 31 are diagrams illustrating schematic configurations of a Thirteenth Embodiment of the invention, and FIG. 28 is a plan view, FIG. 29 is a cross-sectional view taken along line A—A of FIG. 28, FIG. 30 is a enlarged plan view of a bimorph vibrator used in this embodiment, and FIG. 31 is an enlarged cross-sectional view of FIG. 30. In the above-mentioned embodiments, the ceramic supporting member was disposed between the cooling fans and the ceramic base. This embodiment has a feature that the cooling fans are fixed directly on the surface of the ceramic base.

Namely, the cooling fans 19 are fixed on the ceramic base 12 using the adhesive agent 43. This embodiment is preferable to increase the thermal conductivity. The end of each cooling fan 19 is buried into the surface of the ceramic base 12. Each cooling fan 19 is arranged in a matrix of 5×3, and stands perpendicularly on the surface of the ceramic base 12.

First terminals 44 connected to the positive electrode of the piezoelectric elements are provided on the vibration fins 21 of the cooling fans 19. Terminals 44 are connected in parallel using first lead wires 45. One end of the lead wires 45 is connected to the some lead 16a through the second terminal 46 and the through hole (not shown) formed into the ceramic base 12.

The negative electrodes of the piezoelectric elements 20 are also connected in parallel using the third lead wire 47. The end of the third lead wire 47 is connected to the another lead 16b through the third terminal 48. This invention is not limited to these wiring methods, but a printed wiring method may also be used. The voltage is applied to each of the piezoelectric elements 20 of the each cooling fans 19.

Each fin 21 vibrates as shown by the arrows in FIG. 29 when the voltage is applied to each piezoelectric element 20. For example, if the applied voltage is 10 volts, the amplitude of the fins 21 is about 21 is about 1 mm, and the average velocity is obtained about 1.3 m/sec. The surface of the ceramic base 12 is efficiently cooled. If these cooling fans arranged perpendicularly are continuously unificated, same effect will be obtained as the five cooling fans.

Figure 32:
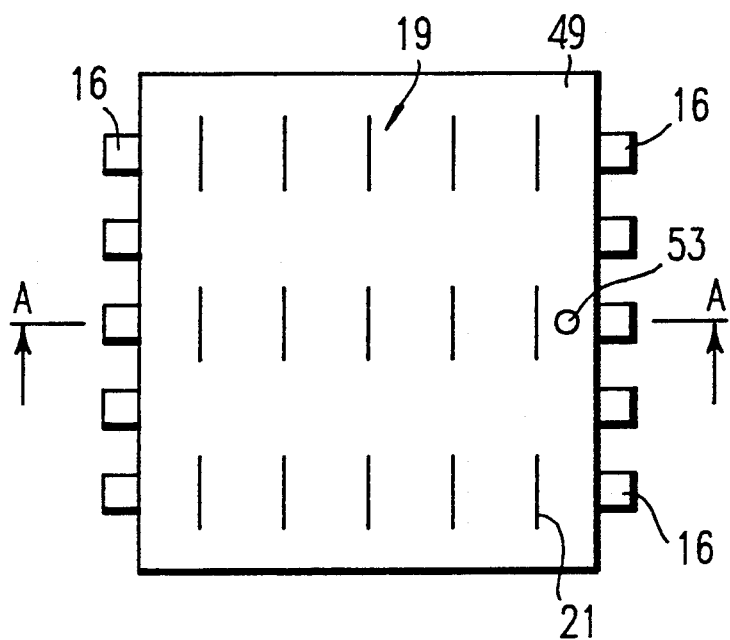
FIGS. 32 and 33 are diagrams illustrating schematic configurations of the electronic device according to a fourteenth embodiment of the invention.
Figure 33:
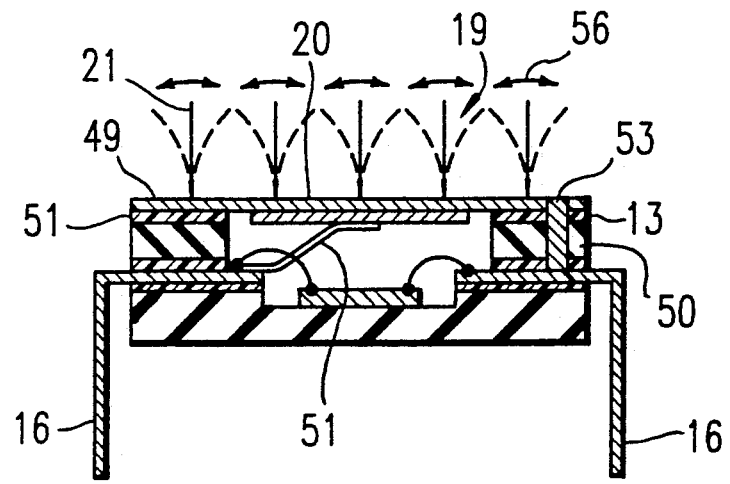

Fourteenth Embodiment:

FIGS. 32 and 33 are diagrams illustrating schematic configurations of the Fourteenth Embodiment of the invention, and FIG. 32 is a plan view, and FIG. 33 is a cross-sectional view taken along line A—A of FIG. 32. The ceramic cap 13 is constructed by a metal plate 49 joined on the ceramic ling 50 to expose the terminal of the through hole 52. The ceramic ling 50 and the metal plate 49 are joined by a low melting temperature class 51.

Vibration fins 21 are adhesively attached using the solder on the one side of the metal plate 49 in the state of the standing. A piezoelectric element 20 adhesively attached on the opposite side of the metal plate 49. One cooling fan 19 is formed by the metal plate 49 and the piezoelectric element 20 and the vibration fins 21. In this embodiment, the cooling means is constructed by fifteen cooling fans 19.

The metal plate 49 is electrically connected to the terminal 53 provided outside of the ceramic cap 13 through the through hole 52 using the soldering or another method. The opposite surface not being joined to the metal plate 49 of the piezoelectric element 20 is electrically connected to a spring plate 54 soldered to the lead frame 16. The electrical connection between the lead frame 16 and the metal plate 49 may be welded using the conventional seam welding method which the KOVAR (Trade mark of Westinghouse Co.) ling made of the Fe-Ni-Co alloy and the metal plate are welded using a solder, e.g., a silver solder. The laser welding or the soldering method may be also used.

The metal plate 49 vibrates up and down in the direction of a lengthwise arrow 5 shown in the FIG. 33 when the A.C. voltage is applied between the the electrode the piezoelectric element do not being connected to the metal plate and the metal plate 49. This vibration of the piezoelectric element 20 induces the vibration in the direction of lateral arrows 56 as shown in the FIG. 33. There are electrodes on the both sides of the piezoelectric element 20. One side electrode of the piezoelectric element 20 is adhesivedly attached on the surface of the metal plate 49. This embodiment has a feature which the piezoelectric element may be only one, end the effect is also same as that of the above-mentioned embodiments.

Figure 34:
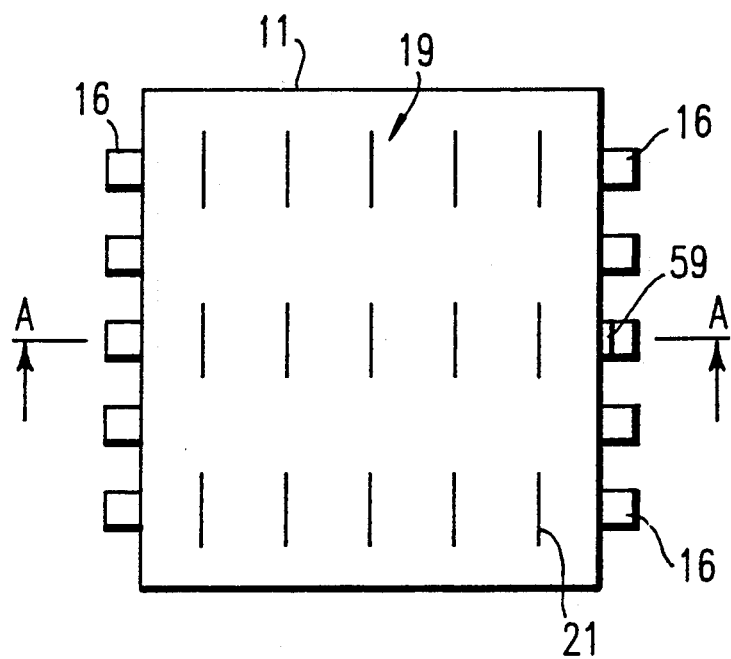
FIGS. 34 and 35 are diagrams illustrating schematic configurations of the electronic device according to a fifteenth embodiment of the invention.
Figure 35:
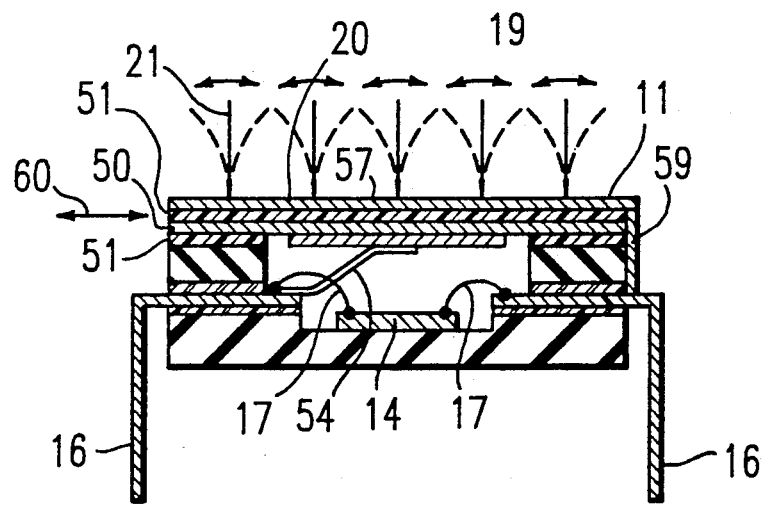

Fifteenth Embodiment:

FIGS. 34 and 35 are diagrams illustrating schematic configurations of a Fifteenth Embodiment of the invention, and FIG. 34 is a plan view, and FIG. 35 is a cross-sectional view taken along line A—A of FIG. 34. It is a feature that this embodiment uses a thickness shear piezoelectric element 20 which seals the package body 11 to the ceramic ling 50 using the low melting temperature glass 52. Vibration fins 21 are adhesived directly on the thickness shear piezoelectric element 20 in the state of standing using the solder. The cooling fan 19 is constructed by the thickness shear piezoelectric element 20 and the vibration fins 21. This piezoelectric element 20 vibrates horizontally by the applying a voltage between the electrodes 57 and 58, because the element 20 has a horizontal polarization.

The electrode 57 of the piezoelectric element 20 is electrically connected to the lead of the lead frame which does not connect to the semiconductor chip 14 using the bonding wires through a metal layer 59. In this way, the metal layer 59 does not contact to opposite to the electrode 58. The opposite electrodes 58 of the piezoelectric element 20 keeps the electrical connection to the lead frame through the spring plate 54.

Generally, the vibration direction of the piezoelectric element is determined by the polarization direction of the piezoelectric element and the voltage application direction. In this embodiment, the polarization direction is horizontal and the voltage application direction is vertical. As a result, the thickness shear piezoelectric element 20 vibrates in the horizontal direction shown by the arrow 60 and the vibration fins 21 also vibrate in the horizontal direction. The conversion efficiency the vibration is better is use the thickness shear piezoelectric element, and the manufacturing is easy because the piezoelectric element is a single layer.

Figure 36:
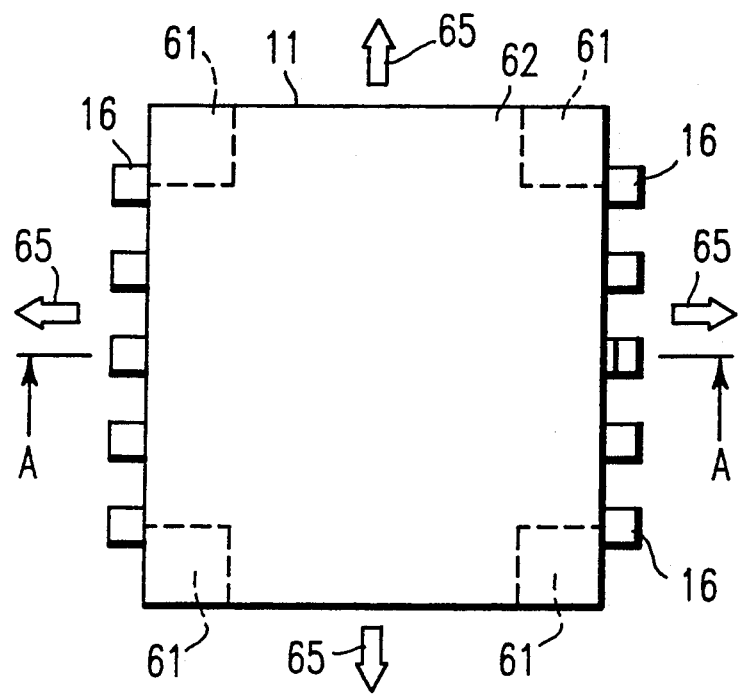
FIGS. 36 and 37 are diagrams illustrating schematic configurations of the electronic device according to a sixteenth embodiment of the invention.
Figure 37:
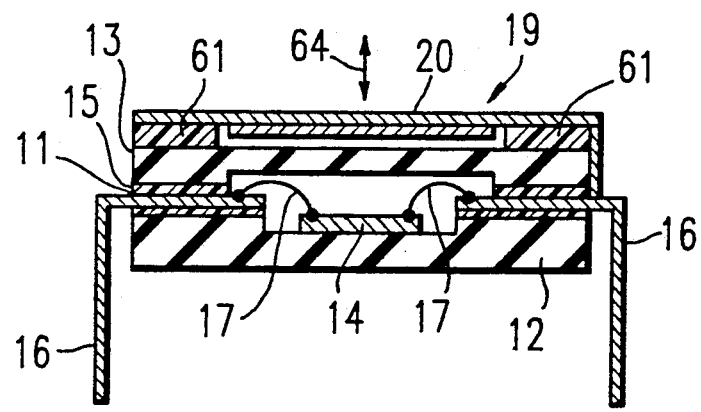

Sixteenth Embodiment:

FIGS. 36 and 37 are diagrams illustrating schematic configurations of a Sixteenth Embodiment of the invention, and FIG. 36 is a plan view, and FIG. 37 is a cross-sectional view taken along line A—A of FIG. 36. The package body 11 consists of the ceramic base 12 and the ceramic cap 13. The semiconductor chip 14 is mounted on the ceramic base 12. These elements are sealed using the low melting temperature glass 15 and an electronic component is formed.

The terminals of the semiconductor chip 14 are taken out to the outside of the package body 11 through the bonding wires 17 and the lead frame 16. Four ceramic supporting members 61 (shown by dotted parts) are disposed on the corners of the ceramic cap 13. A vibration plate 62 is provided on the ceramic supporting members 61 and the piezoelectric least 20 is adhesively attached on the surface of the vibration plate 62. The vibration plate 62 is made of brass or stainless steel and the thickness is 50 $\mu$m through 100 $\mu$m. The cooling fan 19 is constructed by the vibration plate 62 and the piezoelectric element 20. The piezoelectric element 20 is joined to the vibration plate 62 having good transmissibility. The vibration plate 62 is electrically connected to the lead frame 16 through a metal layer 70 disposed on the side wall of the ceramic cap 13.

The other surface of the piezoelectric element 20 not being not joined the electrode is electrically connected to the other lead frame using the lead through gaps between the vibration plate 62 and the ceramic cap 13.

The vibration plate 62 vibrates in the up and down direction shown by an arrow 64 in FIG. 37 appling the A.C. voltage to the piezoelectric element 20. Maximum vibration amplitude is generated on the center of the vibration plate 62. The air between the vibration plate 62 and the ceramic cap 13 is repeated compressing and absorbing. The cooling is accomplished by the movement of the air on the ceramic cap 13. Namely, the air is moved toward outside of the package body 11 (shown by arrows 65 is FIG. 36). Concrete cooling effects will be explained as following.

When the ceramic base 13 was made of AlN, the thermal resistance of the package only was 31.4 C/W. When the vibration plate 62 and piezoelectric element 20 were disposed on the ceramic base 13, the thermal resistance was 25.8 C/W. The thermal resistance decreased to 18.3 C/W when the vibration plate 62 was vibrated.

When the ceramic base 13 was made of Al$_2$O$_3$, the thermal resistance of the package only was 38.3 C/W. When the vibration plate 62 and the piezoelectric element 20 were disposed on the ceramic body 13, the thermal resistance was 32.0 C/W. The thermal resistance decreased to 25.4 C/W when the vibration plate 62 was vibrated.

The thermal conductivity of the A$_1$N ceramic is 80 W/mk and Al$_2$O$_3$ is 15 W/mk. It has become plain that the effect based on the vibration was larger the larger was the thermal conductivity of the ceramic base material. The cooling effect of this embodiment was a match for the vibration having the air flow velocity of 1.5 m/sec using the cooling fins.

Figure 38:
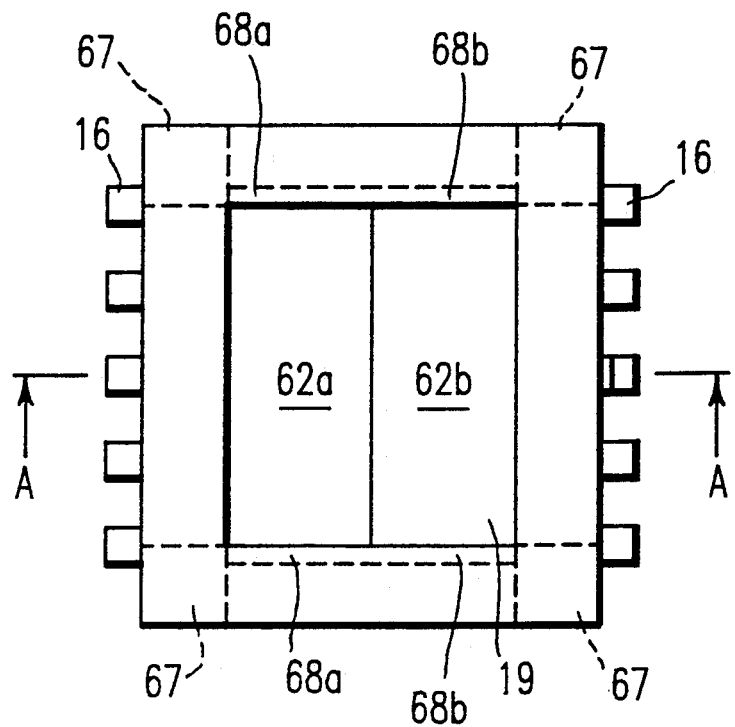
FIGS. 38 and 39 are diagrams illustrating schematic configurations of the electronic device according to a seventeenth embodiment of the invention.
Figure 39:
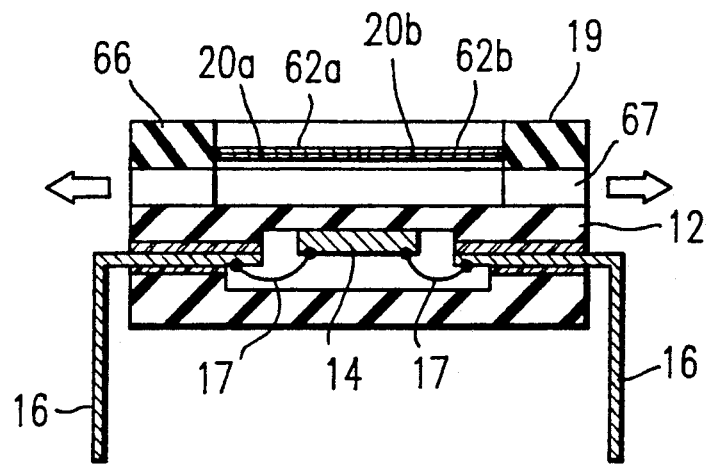

Seventeenth Embodiment:

FIGS. 38 and 39 are diagrams illustrating schematic configurations of a Seventeenth Embodiment of the invention, and FIG. 38 is a plan view, and FIG. 39 is a cross-sectional view taken along line A—A of FIG. 38. A supporting plate is about same size to the ceramic base 12 and is hollowed out at its center portion. The supporting plate 66 is supported by four supporting portions 18. End portions 68a and 68b of two vibrating plates 62a and 62b are respectively fixed on the supporting plate 66. Two piezoelectric elements 20a and 20b are adhesively attached on the center portion, namely on the hollowed portion, of the supporting plate 66. The cooling fan 19 is formed by the vibration plates 62a and 62b, the supporting plate 66 and the piezoelectric elements 20a and 20b.

Each of the piezoelectric elements 20a have applied thereto and 20b voltages to be reversed phases of the vibrations of the two vibration plates 62a and 62b. As a result, movements of vibration plates 62a and 62b are controlled the air flows smoothly. This embodiment can obtain larger cooling effect than the Sixteenth Embodiment. This embodiment has two vibration plates, however, the same effect can be obtained using the more than two.

Figure 40:
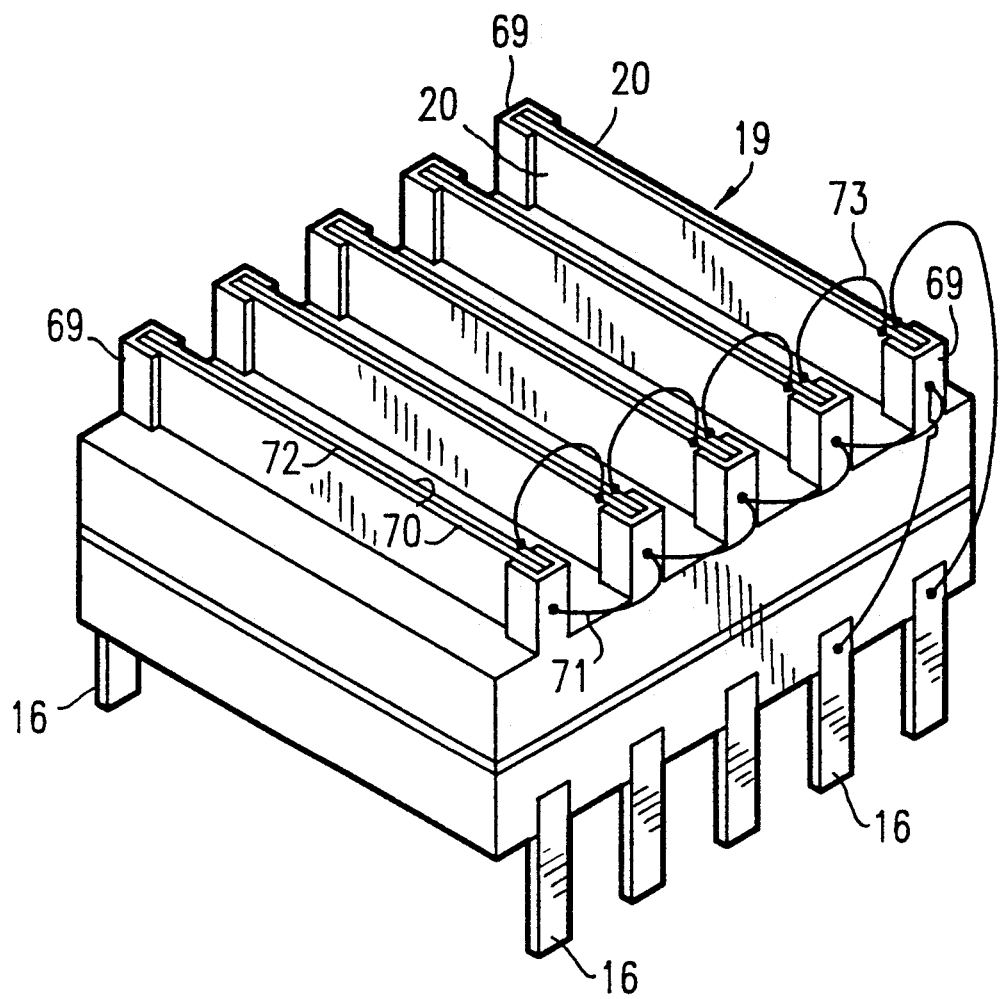
FIG. 40 is a perspective view of illustrating a schematic configuration of the electronic device according to an eighteenth embodiment of the invention.

Eighteenth Embodiment:

FIG. 40 is a perspective view illustrating a schematic configuration of an Eighteenth Embodiment of the invention. Five pair of supporting members 69 are provided on the package body 11. A pair of piezoelectric elements 20 having about the same width as the package base 11 is supported on the supporting members respectively. The cooling fan 19 is formed by these supporting members 69 and piezoelectric elements 20.

One side of five each of the pairs of supporting members 69 is adhesively attaches to outer electrodes 70 forming the outer surfaces of piezoelectric elements 20 using an electroconductive adhesive agent. These supporting members are connected parallel to each other using leads 71. The end of the lead 71 is electrically connected to the lead frame 16.

Inner electrodes 72 of piezoelectric elements 20 are also connected to each other using other lead 73, and its end is electrically connected to the other lead frame 16. The piezoelectric elements 29 vibrate upon application of A.C. voltage between lead frames 16 and operate as the cooling fans.

The connecting methods between the lead frames 16 and the piezoelectric elements 20 are not limited to the above-mentioned method, an other method, e.g., the through holes method shown in the First Embodiment is also preferable. The parallel connection between each piezoelectric elements is not limited only to the above method. This embodiment has a feature that each of that piezoelectric elements is disposed perpendicularly to the surface of the package.

Figure 41:
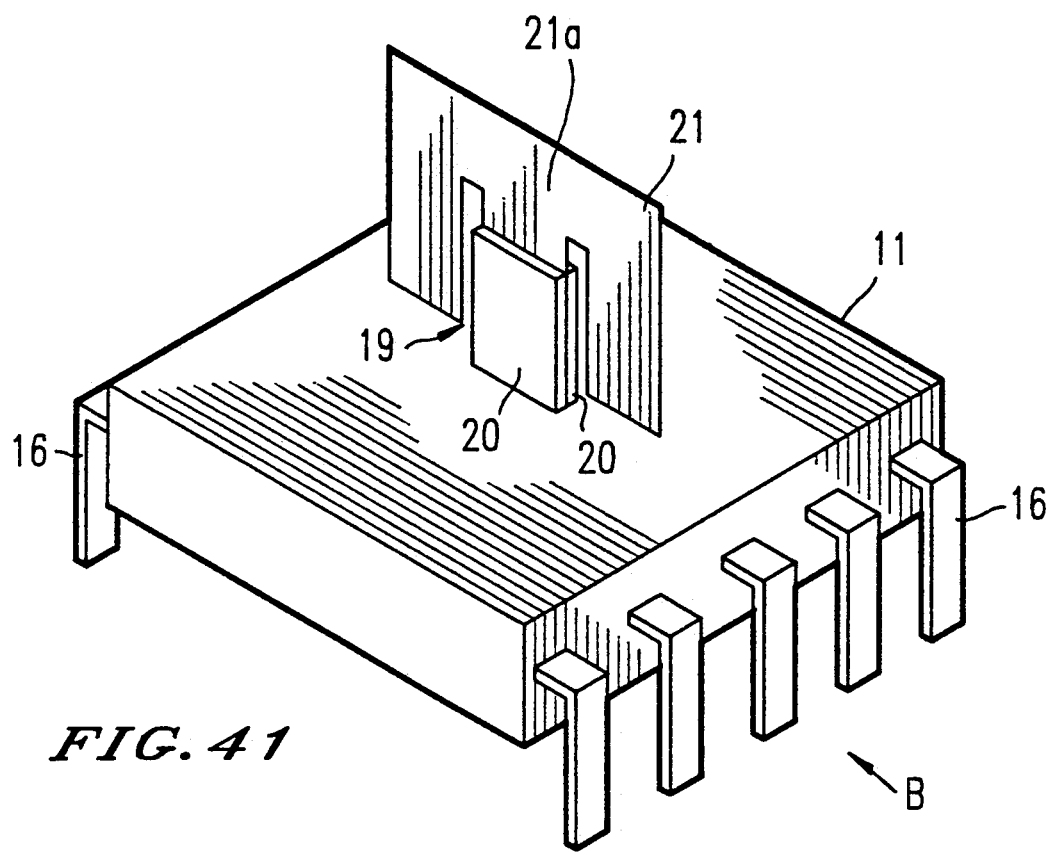
FIGS. 41 and 42 are diagrams illustrating schematic configurations of the electronic device according to a nineteenth embodiment of the invention.
Figure 42:
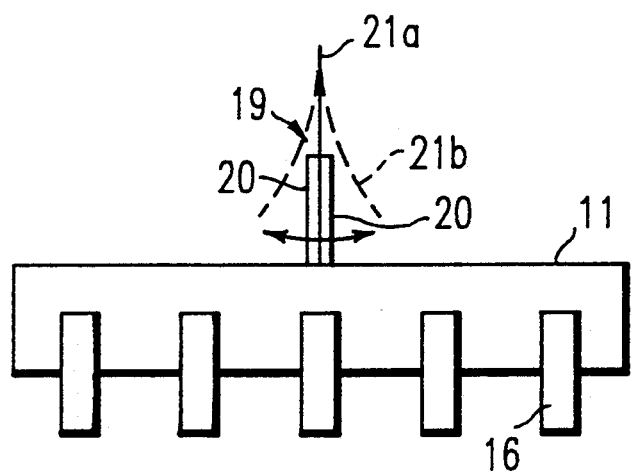

Nineteenth Embodiment:

FIGS. 41 and 42 are diagrams illustrating schematic configurations of a Nineteenth Embodiment of the invention, and FIG. 41 is a perspective view, and FIG. 42 is a side view taken in the direction of the arrow B. The package body is made of Al$_2$O$_3$ and a cooling fan is fixed thereon using an epoxy resin in the standing state. The cooling fan 19 is constructed by a pair of piezoelectric elements 20 and the vibration fin 21 partly sandwiched between each elements 20. The vibration fin 21 is comprised a T-shaped part 20a and a side part 20b. The side part 20b is integrally formed with the T-shaped part 20a, and is hanged toward the package 11. The lead frame 16 is induced out of the package 11. The vibration fin 21 vibrates in the dotted direction shown in FIG. 42, the cooling flow generates toward the surface of the package 11.

Figure 45:
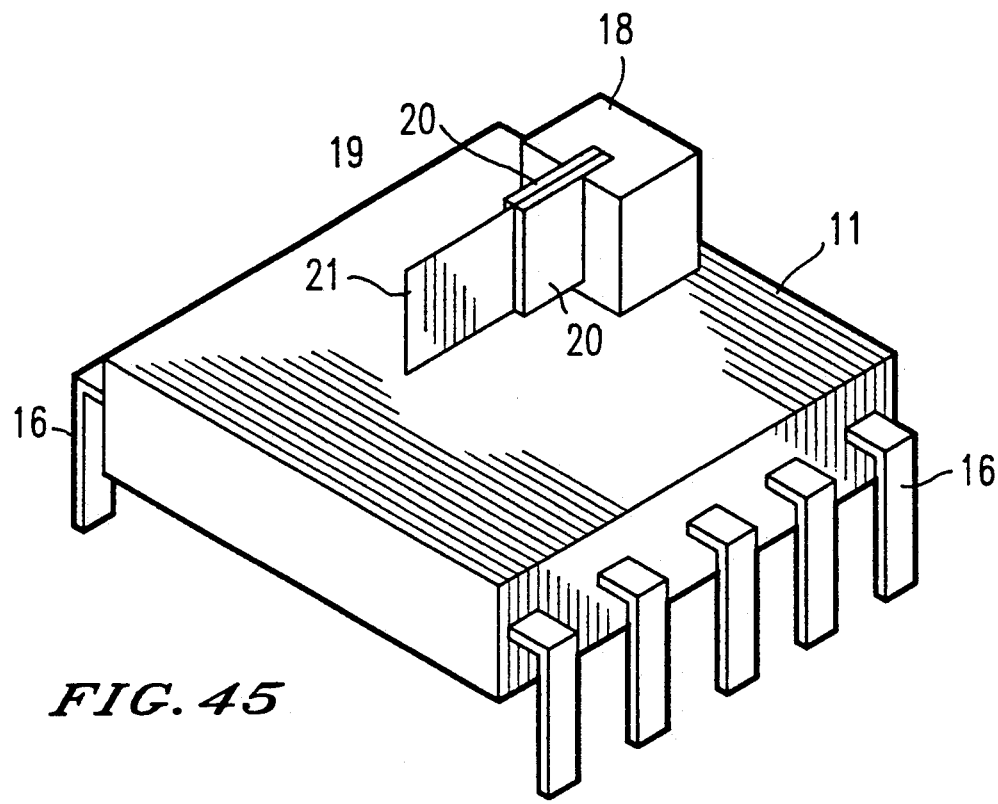
FIGS. 45 and 46 are perspective view to estimate the effect of electronic devices according to different embodiments of the invention.
Figure 46:
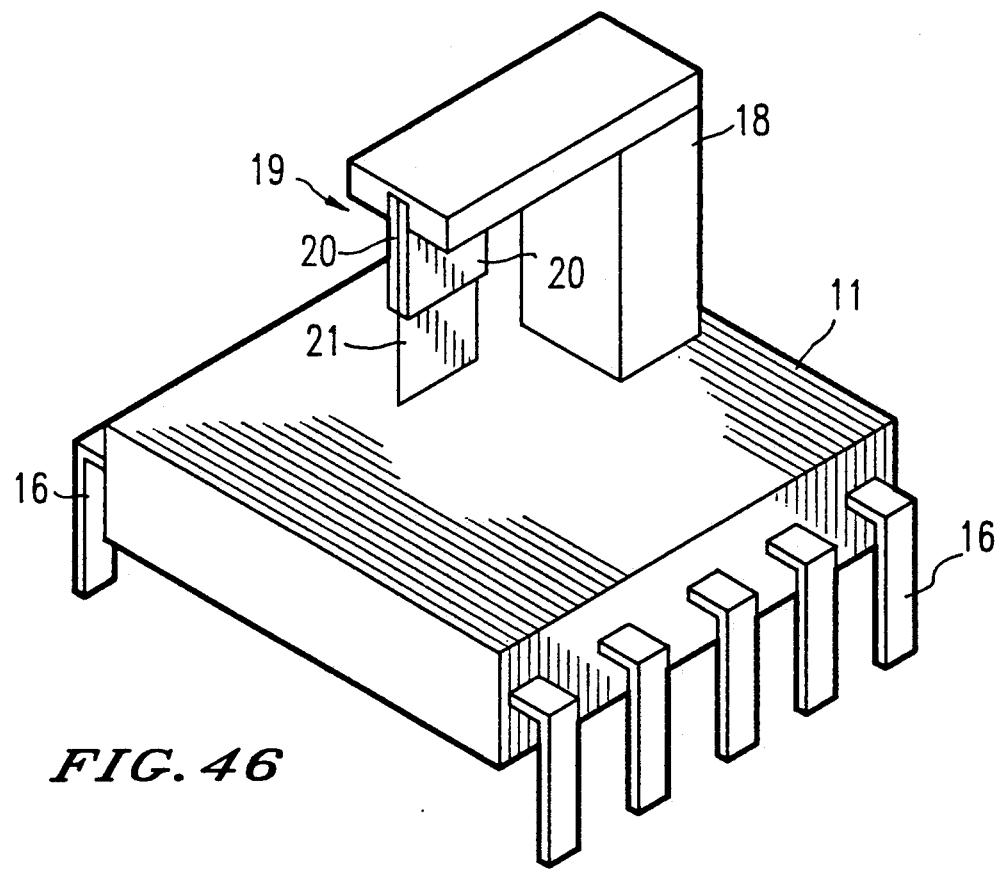

The effect of this embodiment will be explained as following using comparative examples. Namely, the single package without the cooling fan is the 1st comparative example. The 2nd comparative example is a lateral flow type shown in FIG. 45 in which the cooling fan 19 is disposed in parallel to the package 11. The 3rd comparative example is vertical flow type shown in FIG. 46 in which the cooling fan 19 perpendicularly disposed to the package 11.

Table 3 describes the thermal resistance of the package and the minimum disposing height necessary for the cooling fan. Cooling abilities of these cooling fans are assumed to be the same. The disposing height of the cooling fan of the 2nd example was assumed 100%.

TABLE 3

|  | thermal resistance (%/W) | disposed height (%) |
|---|---|---|
| 1st example (package) | 38.3 | — |
| 2nd example (lateral) | 31.9 | 100 |
| 3rd example (vertical) | 23.5 | 270 |
| nineteenth Embodiment | 23.7 | 140 |

It is clear that the package is effectively cooled and the disposed space also may be saved in the Nineteenth Embodiment. The 2nd comparative example and the 3rd comparative example are of course Embodiment of the present invention.

Figure 43:
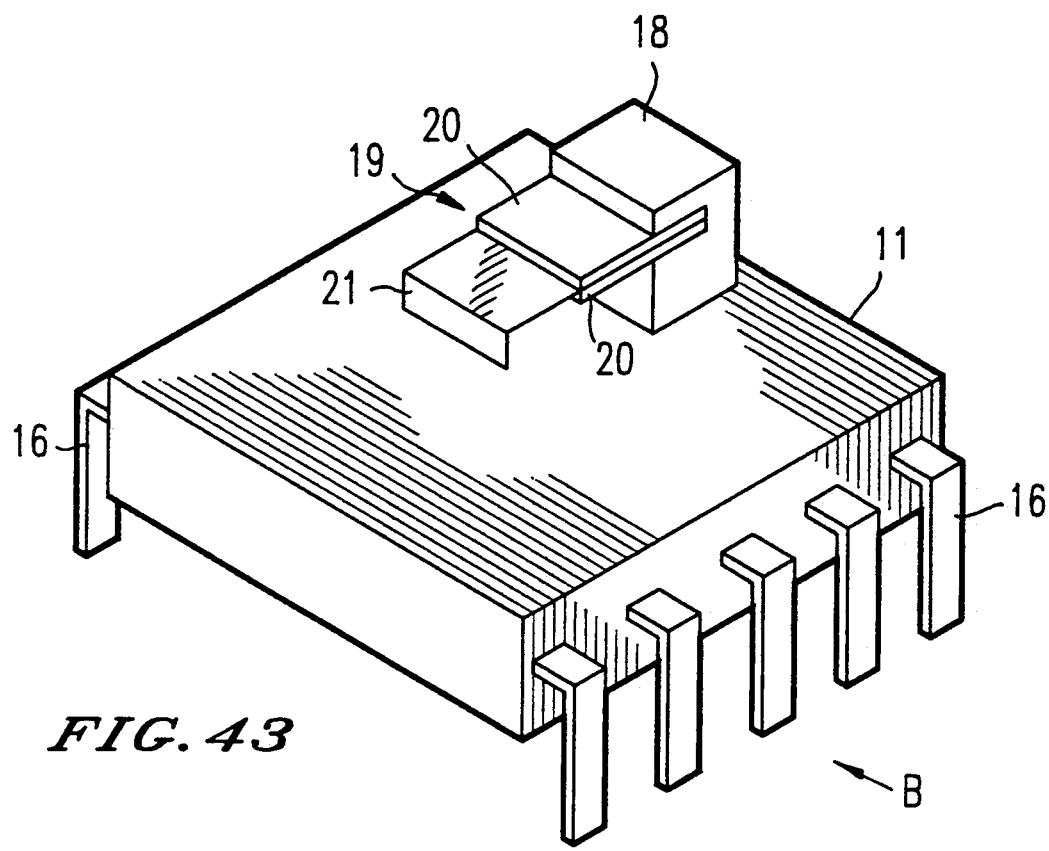
FIGS. 43 and 44 are diagrams illustrating schematic configurations of the electronic device according to a twentieth embodiment of the invention.
Figure 44:
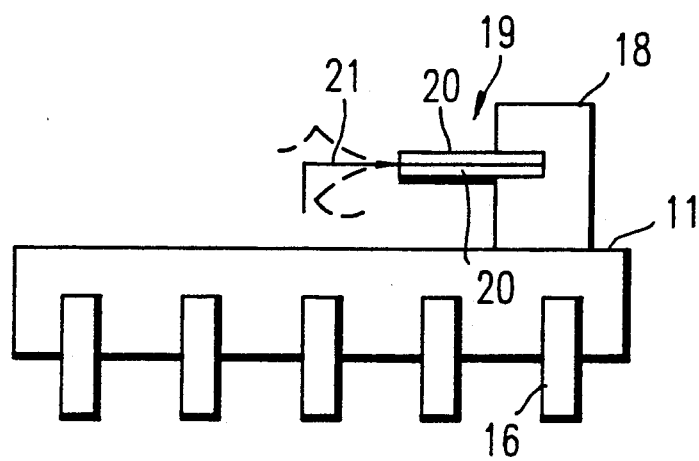

Twentieth Embodiment:

FIGS. 43 and 44 are diagrams illustrating schematic configurations of a Twentieth Embodiment of the invention, and FIG. 43 is a perspective view, and FIG. 44 is a side view taken in the direction of the arrow B. The cooling fan 19 is disposed in parallel on the package body 11 through the ceramic supporting member 18. The cooling fan 19 in constructed by a inverse L-shaped vibration plate 21 and a pair a piezoelectric elements 20 which sandwich the vibration plate 21. The inverse L-shaped vibration plate 21 is turned down toward the package body 11. As result, the air flow is induced efficiently.

In the First, Fourteenth, Fifteenth and Sixteenth Embodiments, these FIGURES are viewed looking like the common use the lead frames for application of voltage to the piezoelectric element and for the semiconductor chip. However, generally, the exclusive lead frame is assigned for the piezoelectric element.

Figure 50:
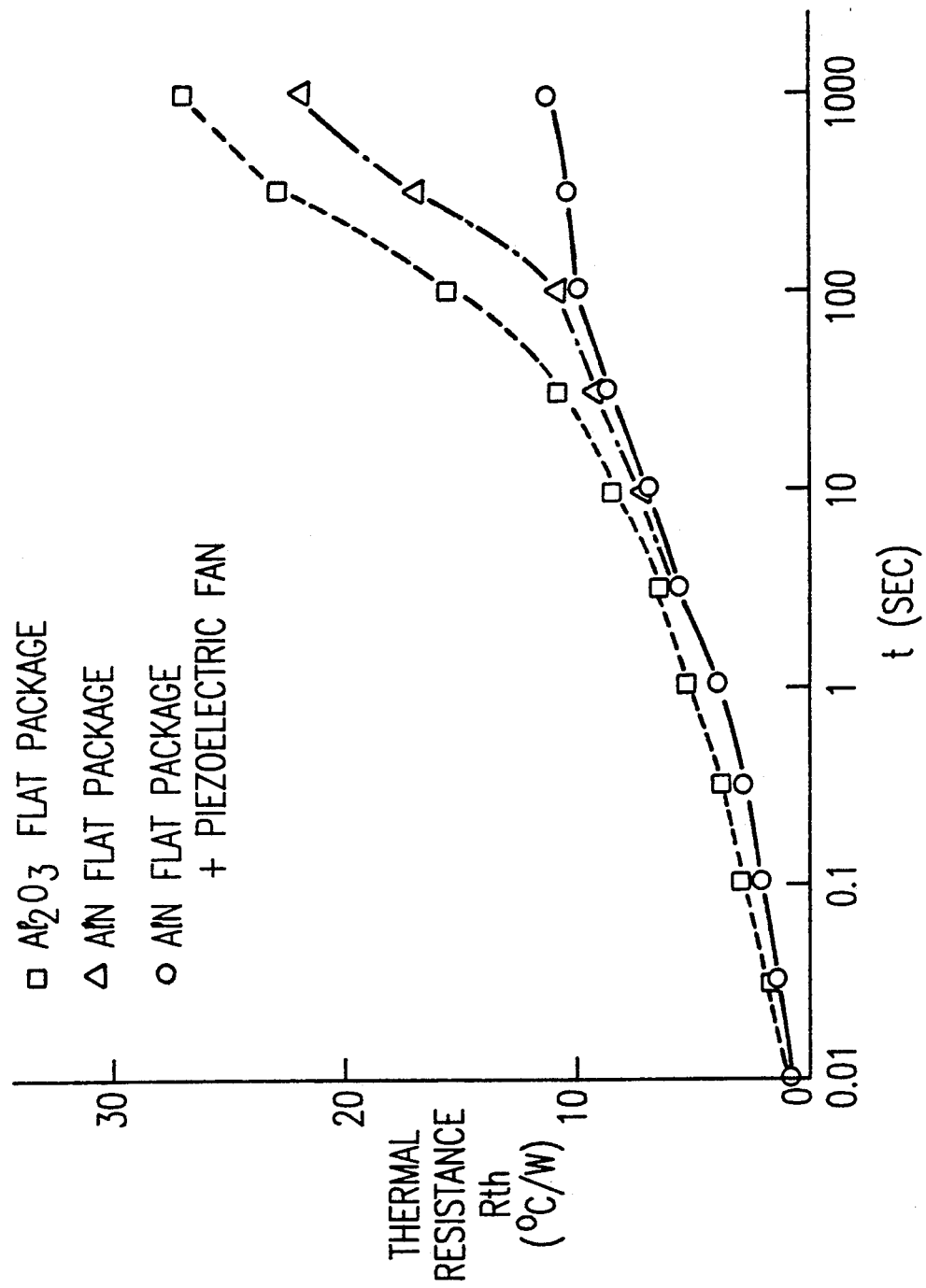
FIG. 50 is a graph illustrating changes of the thermal resistances to explain the effect of the invention.

FIG. 50 is a graph illustrating changes of the thermal resistances to explain the effect of the invention. In FIG. 50, it is clear that the AlN flat package having the piezoelectric fan fixed thereto is the embodiment of the invention exhibting the lowest change of the thermal resistance.

As many apparently widely different embodiments of this invention may be made without departing from the spirit and scope thereof, it is to be understood that the invention is not limited to the specific embodiments thereof except as defined in the appended claims.

We claim:

1. An electronic device, comprising:
   an insulating base member;
   a semiconductor integrated circuit chip having electrodes thereon and being mounted on said base member;
   an insulating cap member being provided on said base member and sealing said chip therebetween;
   a lead frame member having plural leads and extending outside of said base and cap members;
   wire connection members connected between said electrodes of said chip and said lead of said frame;
   a supporting member provided directly on said base member;
   piezoelectric cooling means provided on said supporting member for cooling said chip, including bimorph vibrator means and plural electric terminals connected to said bimorph vibrator means;
   plural through holes being provided through said base member; and
   plural electric connecting members connecting said electric terminals of said cooling means to said leads of said lead frame through said through holes provided through said base member.

2. The electronic device of claim 1, wherein said vibrator means includes plural cooling fans, each fan including a bimorph vibrator.

3. The electronic device of claim 2, wherein each said vibrator includes a pair of piezoelectric elements and a vibrator fin sandwiched therebetween.

4. The electronic device of claim 3, wherein each said fin includes a sub-vibration fin.

* * * * *